US012456597B2

(12) United States Patent
Honda et al.

(10) Patent No.: US 12,456,597 B2
(45) Date of Patent: Oct. 28, 2025

(54) ENERGY FILTER, AND ENERGY ANALYZER AND CHARGED PARTICLE BEAM DEVICE PROVIDED WITH SAME

(71) Applicant: Hitachi High-Tech Corporation, Tokyo (JP)

(72) Inventors: Kazuhiro Honda, Tokyo (JP); Hiroyuki Ito, Tokyo (JP); Takashi Doi, Tokyo (JP); Soichiro Matsunaga, Tokyo (JP)

(73) Assignee: Hitachi High-Tech Corporation, Tokyo (JP)

( * ) Notice: Subject to any disclaimer, the term of this patent is extended or adjusted under 35 U.S.C. 154(b) by 415 days.

(21) Appl. No.: 18/016,764

(22) PCT Filed: Jul. 20, 2020

(86) PCT No.: PCT/JP2020/027993
§ 371 (c)(1),
(2) Date: Jan. 18, 2023

(87) PCT Pub. No.: WO2022/018782
PCT Pub. Date: Jan. 27, 2022

(65) Prior Publication Data

US 2023/0298845 A1 Sep. 21, 2023

(51) Int. Cl.
*H01J 37/05* (2006.01)
*H01J 37/09* (2006.01)
(Continued)

(52) U.S. Cl.
CPC .............. *H01J 37/05* (2013.01); *H01J 37/09* (2013.01); *H01J 37/12* (2013.01); *H01J 37/244* (2013.01);
(Continued)

(58) Field of Classification Search
CPC .. H01J 37/05; H01J 37/09; H01J 37/12; H01J 37/244; H01J 2237/0475;
(Continued)

(56) References Cited

U.S. PATENT DOCUMENTS 5,126,565 A * 6/1992 Rose ........................ H01J 37/05
250/296
5,811,801 A * 9/1998 Tsuno ...................... H01J 49/44
250/305

(Continued)

FOREIGN PATENT DOCUMENTS

CA 2595668 A1 * 8/2006 ............ H01J 49/405
DE 19860988 B4 * 12/2007 .............. H01J 37/05

(Continued)

OTHER PUBLICATIONS

English translation of document C3 (Chinese-language Office Action, filed on Jan. 18, 2023) issued in Taiwanese Application No. 110118647 dated Feb. 23, 2022 (two (2) pages).

(Continued)

*Primary Examiner* — David A Vanore
(74) *Attorney, Agent, or Firm* — Crowell & Moring LLP

(57) ABSTRACT

A decelerating electrode of an energy filter includes an electrode pair that has an opening and a cavity portion provided in a rotationally symmetrical manner with the center of the opening as the optical axis. Voltages with electric potentials that are substantially the same as that of a charged particle beam are independently applied to both sides of the decelerating electrode. When an electrical field protrudes into the cavity portion, a saddle point having the same electric potential as that of incident charged particles is formed inside the decelerating electrode. The saddle point acts as a high pass filter for incident charged particles at an energy resolution of 1 mV or less. By analyzing charged particles which have been energy-separated, it is possible to
(Continued)

measure the energy spectrum and ΔE at the high resolution of 1 mV or less and to obtain an SEM/STEM image with a high resolution.

19 Claims, 19 Drawing Sheets

(51) Int. Cl.
*H01J 37/12* (2006.01)
*H01J 37/244* (2006.01)

(52) U.S. Cl.
CPC .................. *H01J 2237/0475* (2013.01); *H01J 2237/04924* (2013.01); *H01J 2237/057* (2013.01); *H01J 2237/24485* (2013.01)

(58) Field of Classification Search
CPC ....... H01J 2237/04924; H01J 2237/057; H01J 2237/24485; H01J 2237/12; H01J 2237/2801; H01J 37/21; H01J 37/28
See application file for complete search history.

(56) References Cited

U.S. PATENT DOCUMENTS

| | | | | | |
|---|---|---|---|---|---|
| 6,066,852 | A * | 5/2000 | Taya | H01J 37/05 | 250/305 |
| 6,124,592 | A * | 9/2000 | Spangler | H01J 49/4295 | 250/282 |
| 6,150,657 | A * | 11/2000 | Kimoto | H01J 49/44 | 250/305 |
| 6,410,924 | B1 * | 6/2002 | Wang | H01J 37/05 | 250/398 |
| 6,452,169 | B1 * | 9/2002 | Mook | H01J 37/05 | 250/298 |
| 6,646,262 | B1 | 11/2003 | Todokoro et al. | | |
| 7,446,320 | B1 * | 11/2008 | McCord | H01J 37/145 | 250/397 |
| 8,803,102 | B2 * | 8/2014 | Tuggle | H01J 37/244 | 250/397 |
| 8,946,649 | B2 * | 2/2015 | Sasaki | H01J 37/28 | 250/397 |
| 9,048,062 | B1 * | 6/2015 | Ren | H01J 37/05 | |
| 9,336,984 | B2 * | 5/2016 | Bizen | H01J 37/28 | |
| 2004/0144920 | A1 * | 7/2004 | Lopez | H01J 37/153 | 250/311 |
| 2009/0101819 | A1 * | 4/2009 | Zhou | H01J 37/05 | 250/311 |
| 2009/0140135 | A1 * | 6/2009 | Finlay | H01J 49/424 | 250/281 |
| 2009/0289195 | A1 | 11/2009 | Henstra | | |
| 2010/0187436 | A1 | 7/2010 | Frosien et al. | | |
| 2012/0112090 | A1 * | 5/2012 | Henstra | H01J 37/09 | 250/396 R |
| 2013/0256530 | A1 * | 10/2013 | Jiang | H01J 37/153 | 250/307 |
| 2014/0284476 | A1 * | 9/2014 | Ren | H01J 37/05 | 250/336.1 |
| 2015/0102221 | A1 * | 4/2015 | Sasaki | H01J 37/05 | 250/310 |
| 2015/0380206 | A1 * | 12/2015 | White | H01J 37/1472 | 250/396 R |
| 2017/0003235 | A1 | 1/2017 | Firnkes et al. | | |
| 2017/0330723 | A1 | 11/2017 | Mukai | | |
| 2018/0068828 | A1 | 3/2018 | Halling | | |
| 2019/0139734 | A1 | 5/2019 | Mukai | | |
| 2019/0355551 | A1 | 11/2019 | Pavia | | |
| 2020/0258713 | A1 * | 8/2020 | Mizuhara | H01J 37/244 | |
| 2023/0298845 | A1 * | 9/2023 | Honda | H01J 37/12 | 250/305 |

FOREIGN PATENT DOCUMENTS

| | | | | |
|---|---|---|---|---|
| DE | 112020007220 T5 * | 3/2023 | H01J 37/05 |
| EP | 0911860 B1 * | 6/2003 | H01J 37/05 |
| JP | 2002-500414 A | 1/2002 | |
| JP | 2003-331764 A | 11/2003 | |
| JP | 2009-289748 A | 12/2009 | |
| JP | 2012-104483 A | 5/2012 | |
| JP | 2017-204375 A | 11/2017 | |
| JP | 2019-87337 A | 6/2019 | |
| KR | 10-2002-0077457 A | 10/2002 | |
| KR | 10-2017-0140390 A | 12/2017 | |
| KR | 20230017264 A * | 2/2023 | H01J 37/05 |
| TW | 201703093 A | 1/2017 | |
| TW | 201824325 A | 7/2018 | |
| WO | WO 2016/176507 A1 | 11/2016 | |
| WO | WO-2022018782 A1 * | 1/2022 | H01J 37/05 |

OTHER PUBLICATIONS

International Search Report (PCT/ISA/210) issued in PCT Application No. PCT/JP2020/027993 dated Oct. 13, 2020 with English translation (six (6) pages).
Japanese-language Written Opinion (PCT/ISA/237) issued in PCT Application No. PCT/JP2020/027993 dated Oct. 13, 2020 (three (3) pages).
Chinese-language Office Action issued in Taiwanese Application No. 110118647 dated Feb. 23, 2022 (three (3) pages).
Maldonado et al., "Evaluation of electron energy spread in CsBr based photocathodes", J. Vac. Sci. Technol. B 26(6), Nov./Dec. 2008, pp. 2085-2090 (six (6) pages).
Adachi et al., "Performance computations for a high-resolution retarding field electron energy analyzer with a simple electrode configuration", J. Phys. D: Appl. Phys., 14(1981) 769-78 (ten (10) pages).
Korean-language Office Action issued in Korean Application No. 10-2022-7045643 dated Nov. 14, 2024 (6 pages).

* cited by examiner

[FIG. 1]
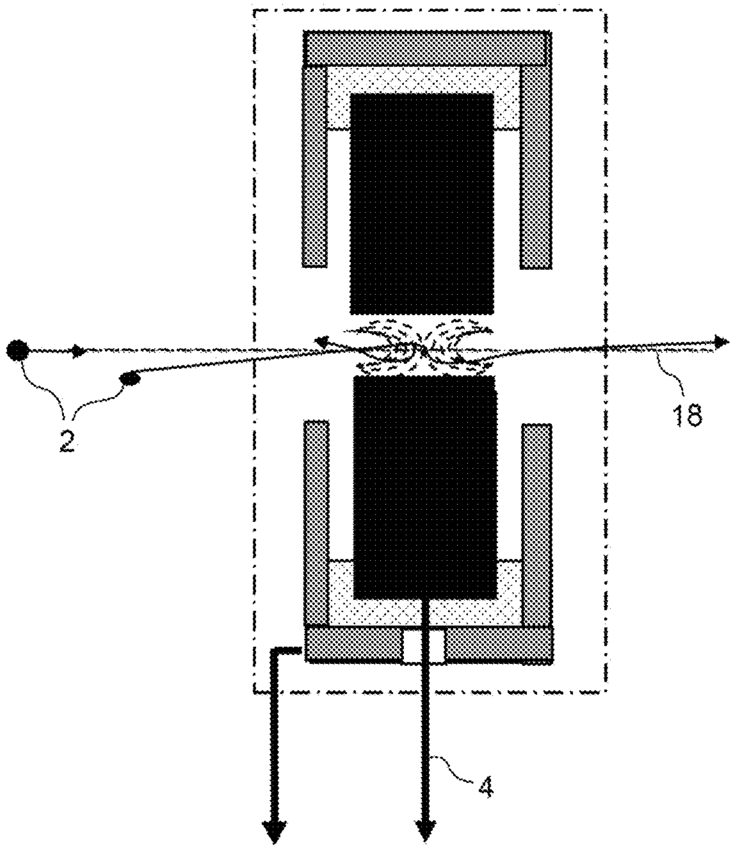

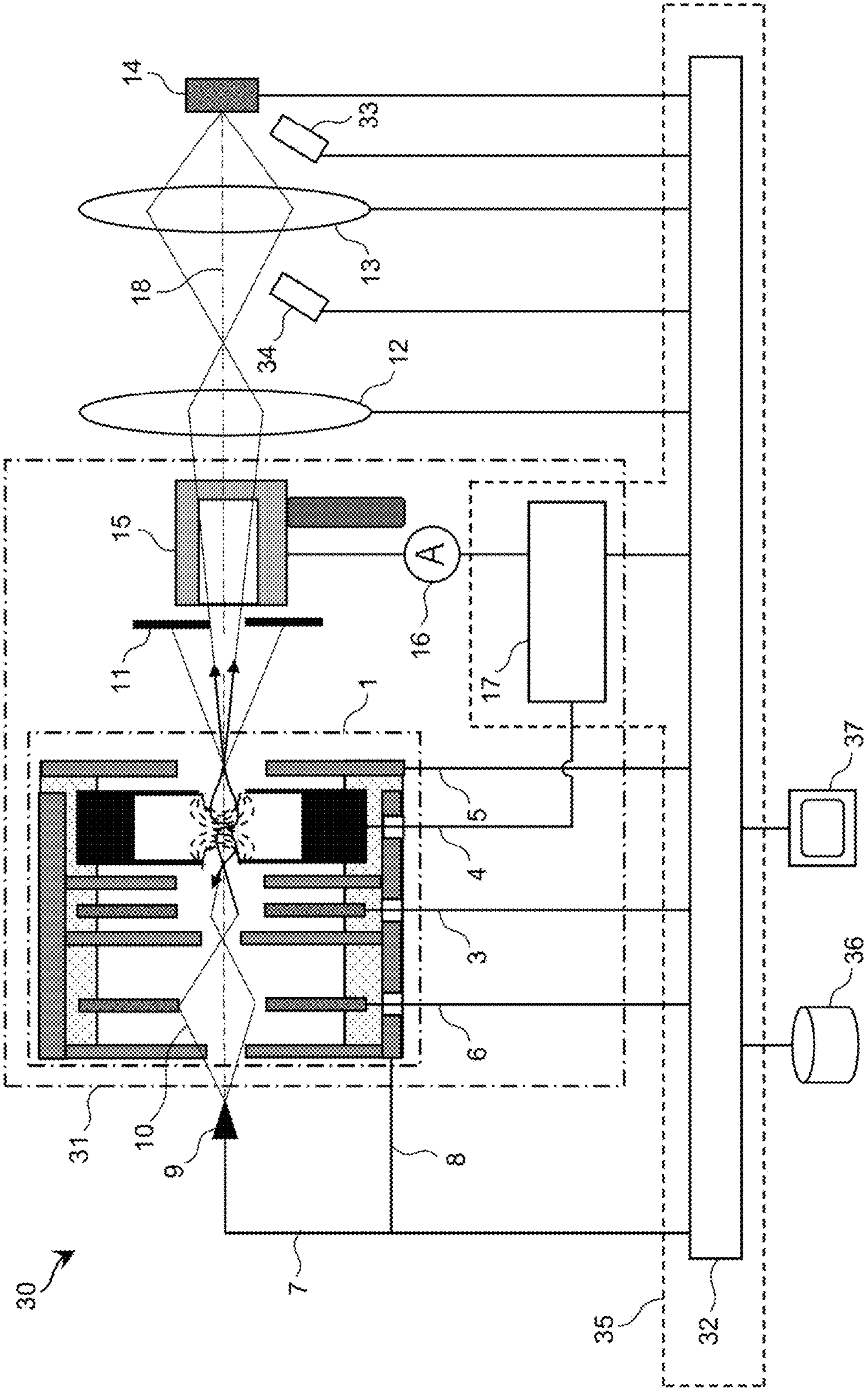
[FIG. 2]

[FIG. 3]
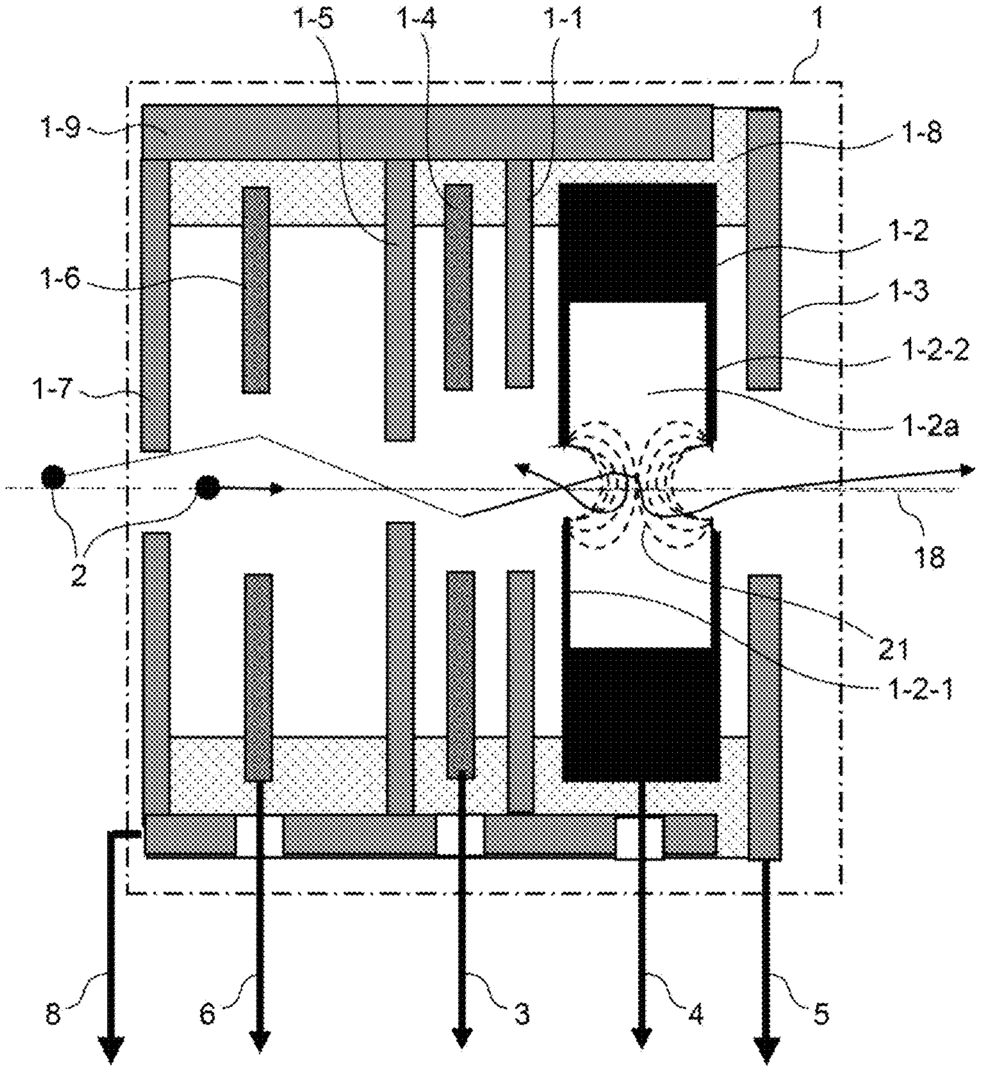

[FIG. 4A]
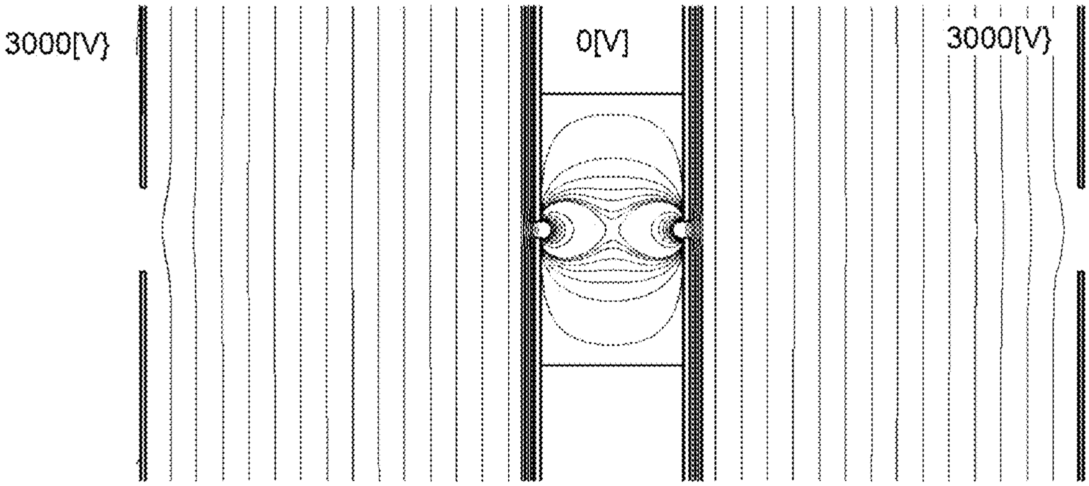
[FIG. 4B]
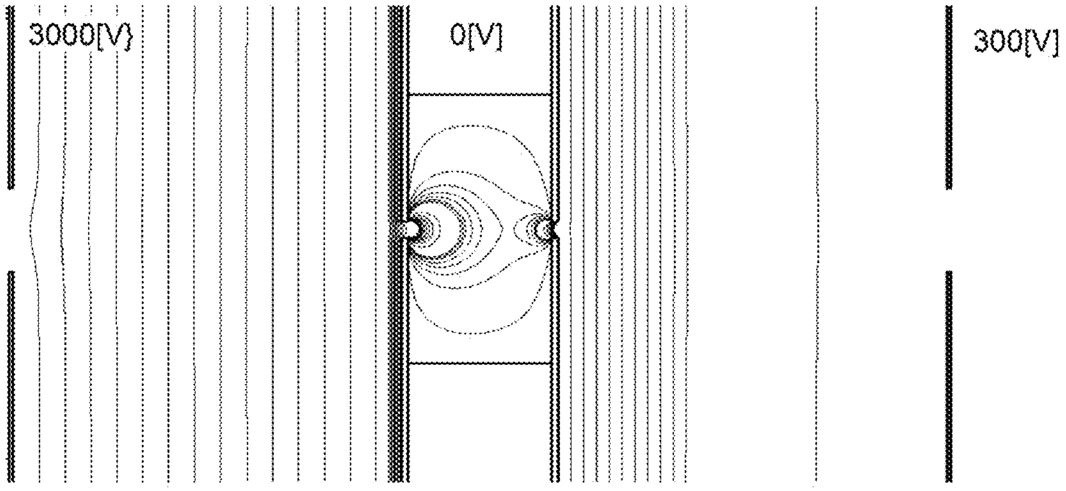

[FIG. 4C]
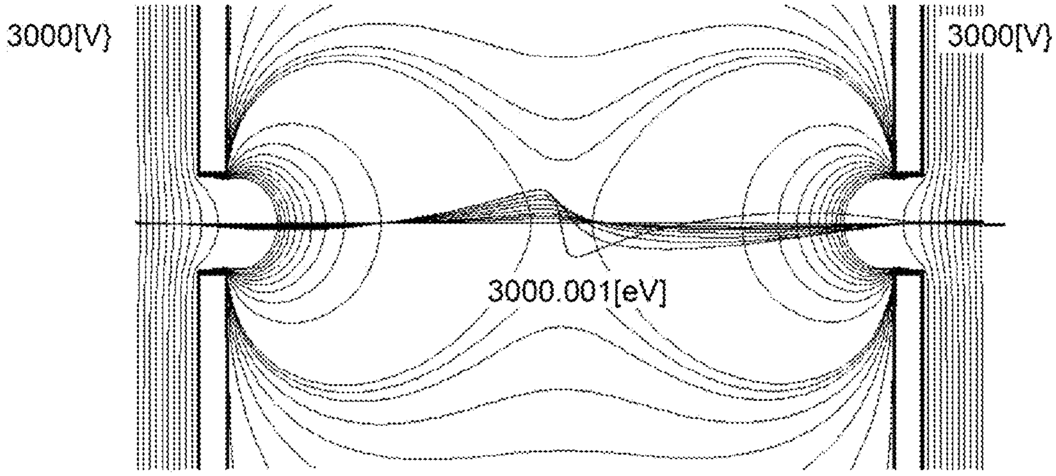
[FIG. 4D]
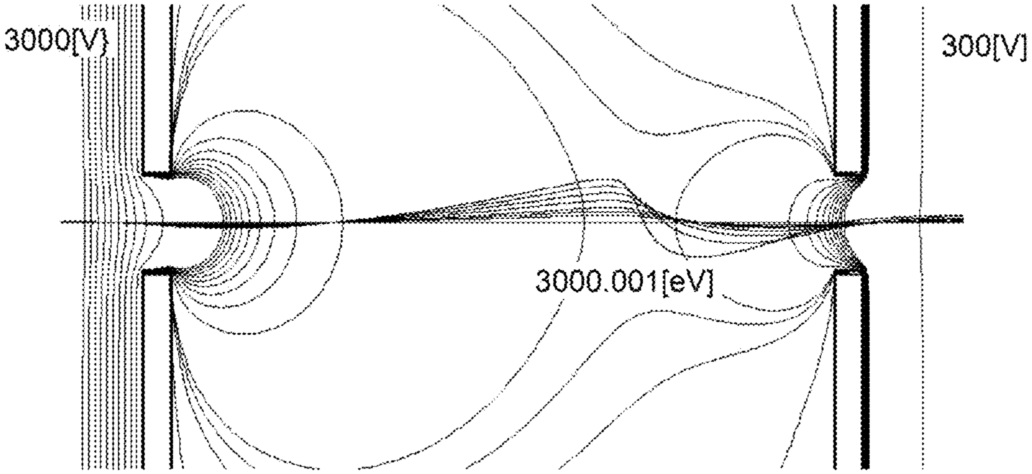

[FIG. 5A]
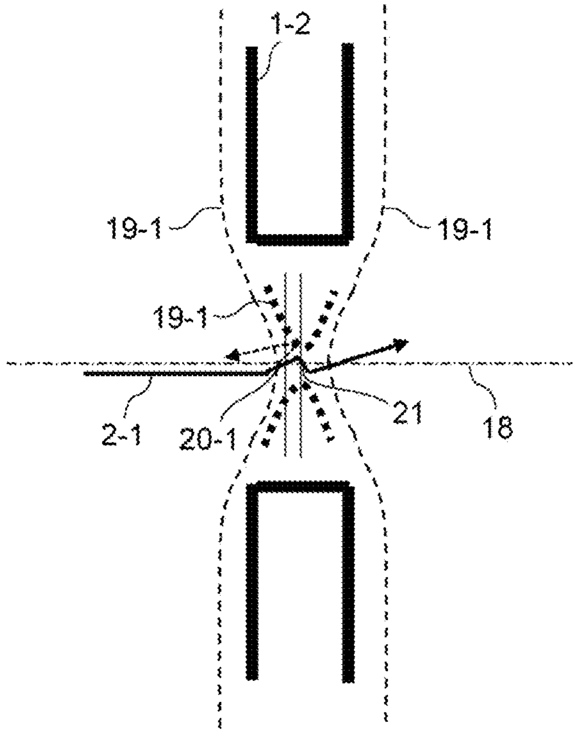
[FIG. 5B]
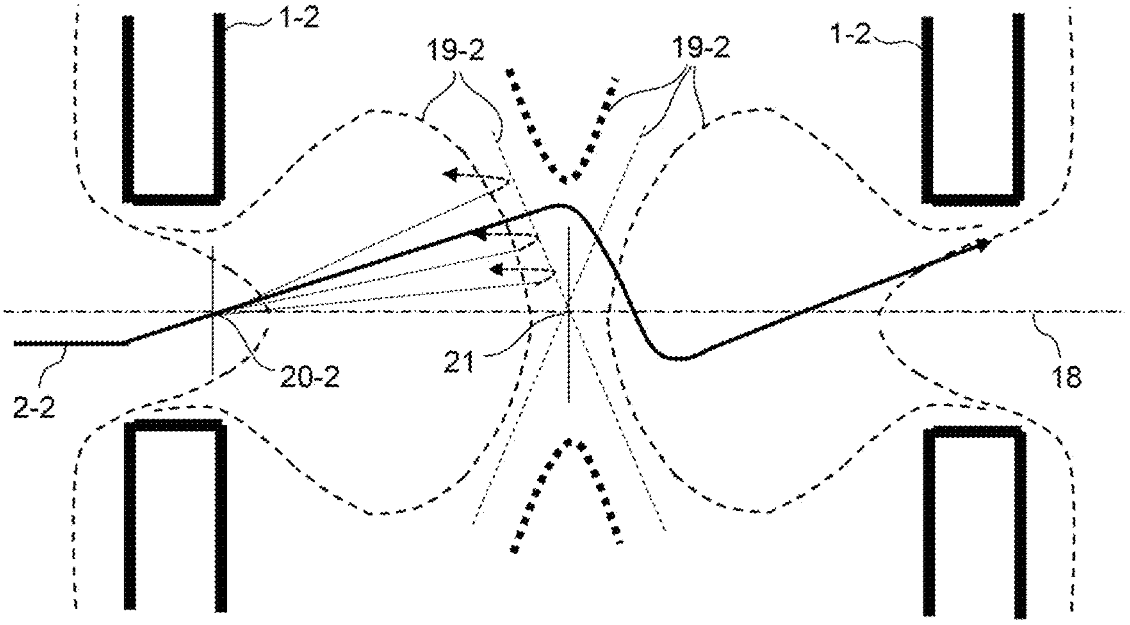

[FIG. 6A]
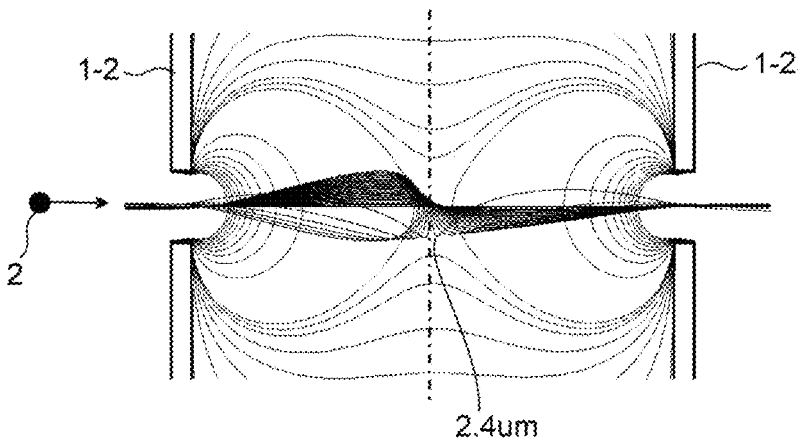
[FIG. 6B]
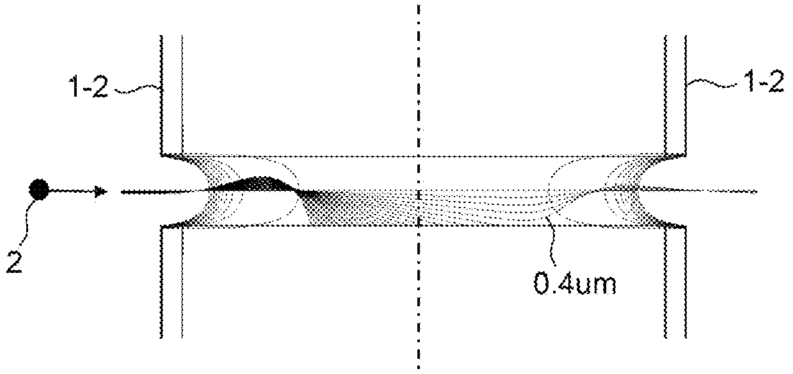
[FIG. 6C]
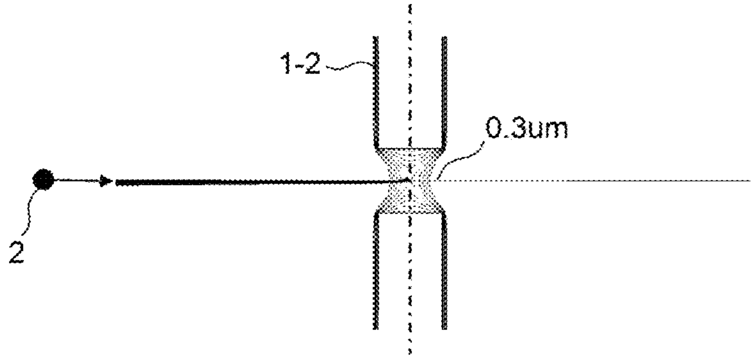

[FIG. 6D]
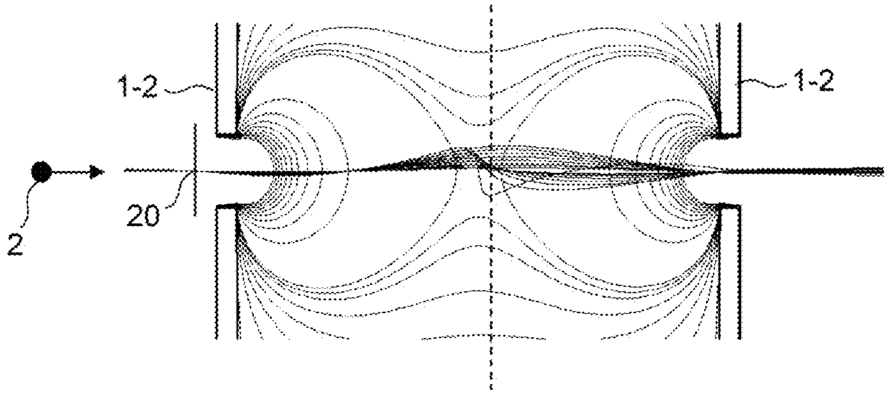
[FIG. 6E]
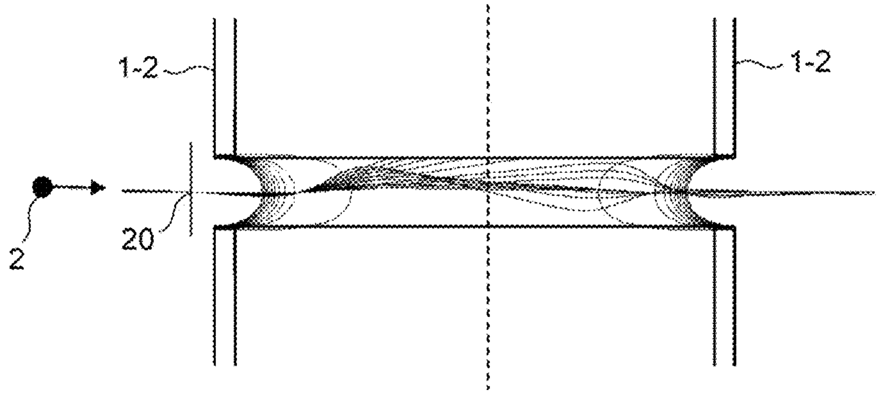
[FIG. 6F]
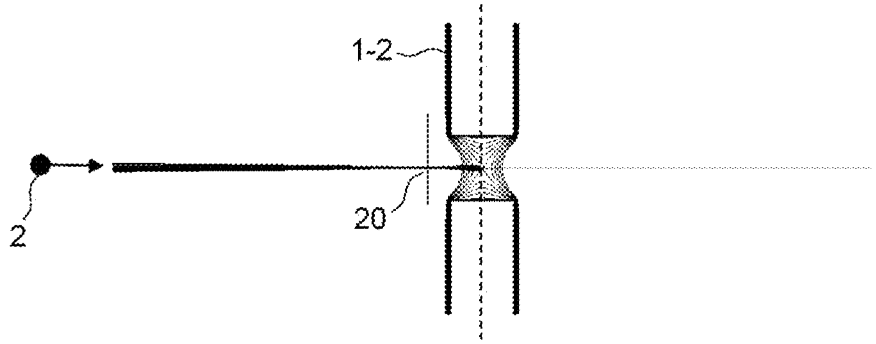

[FIG. 7]
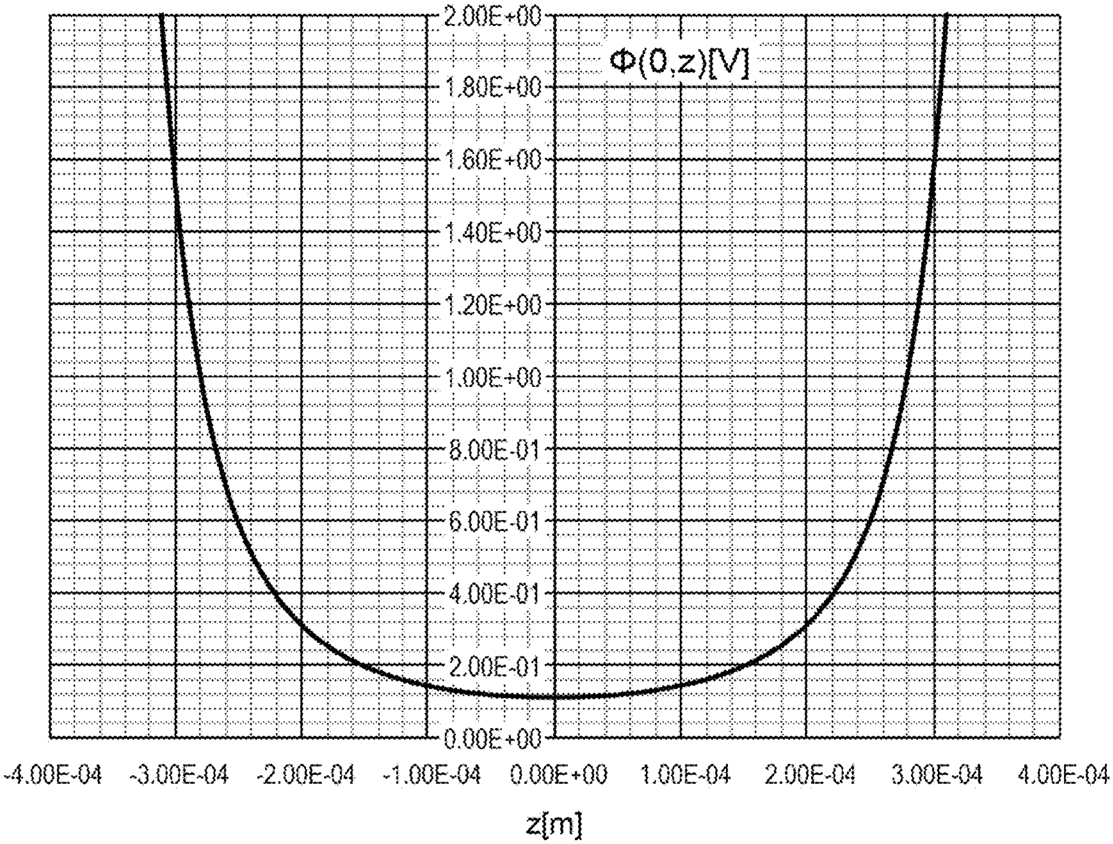

[FIG. 8]
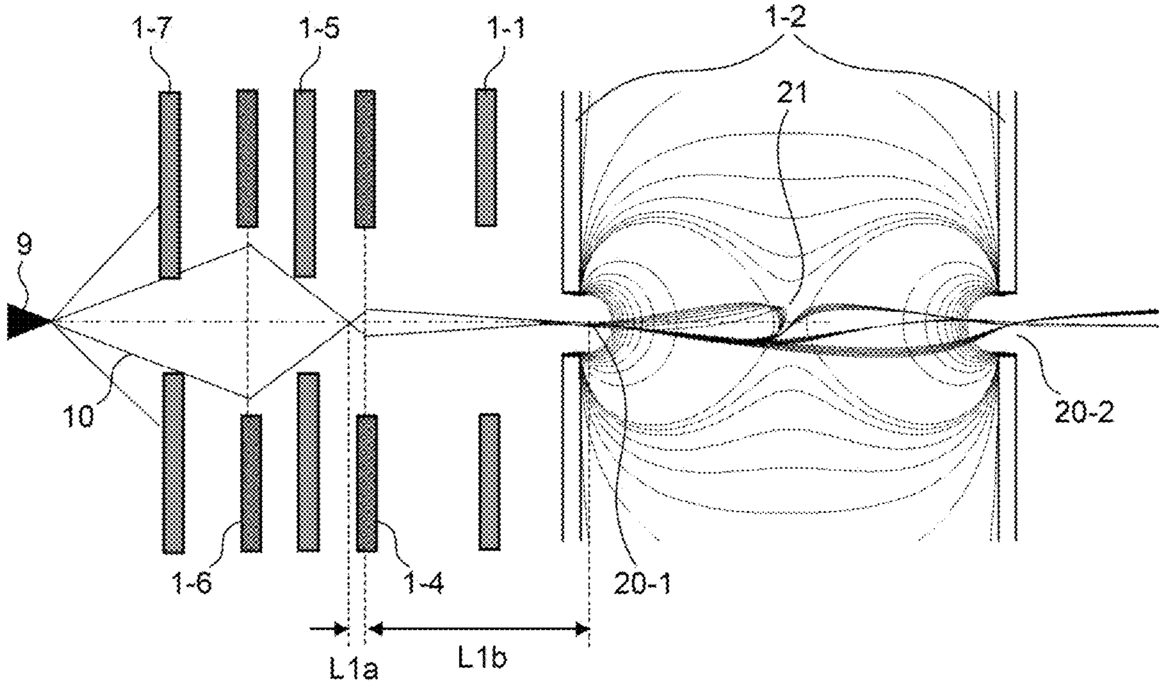

[FIG. 9A]
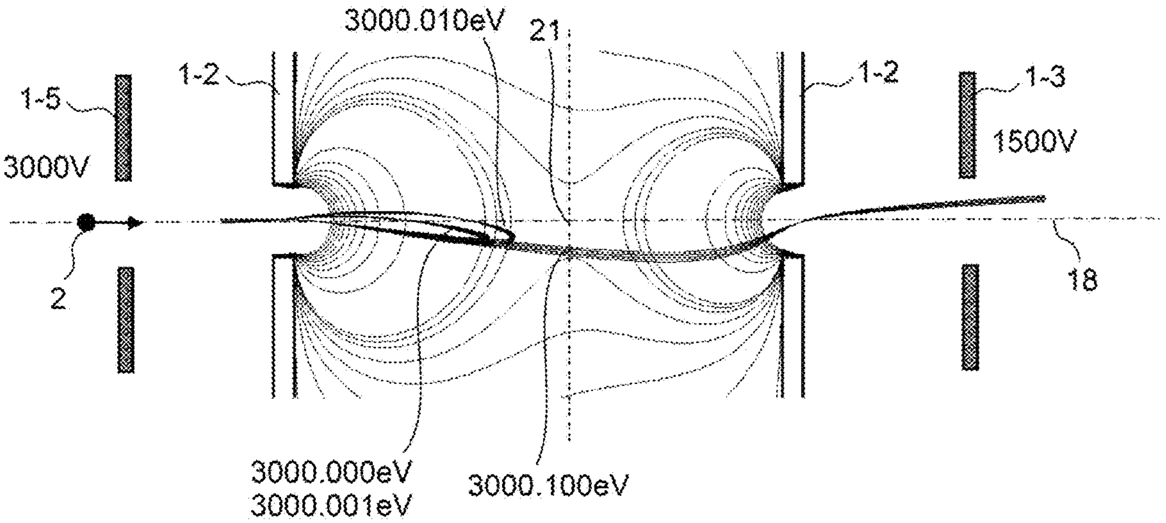
[FIG. 9B]
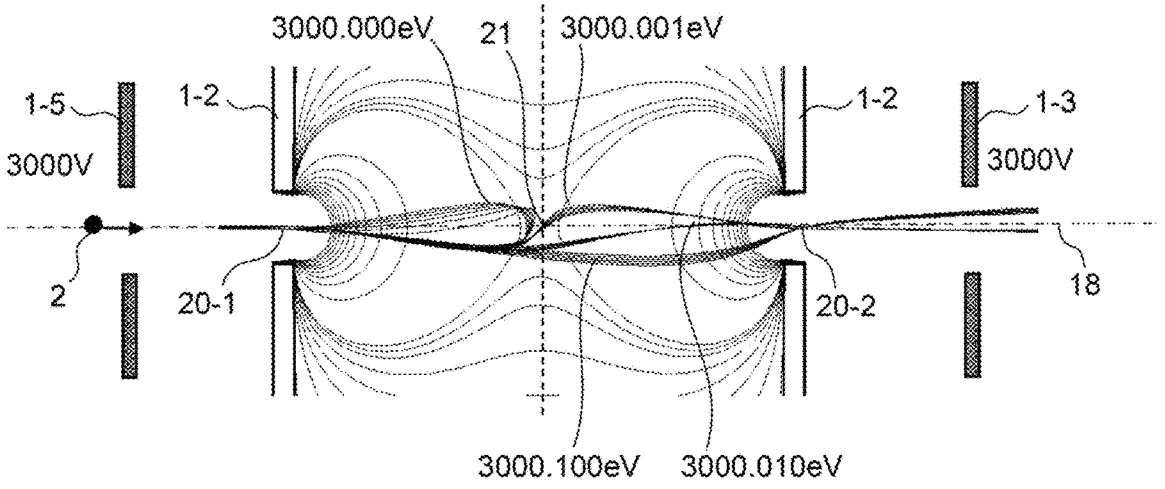

[FIG. 10A]
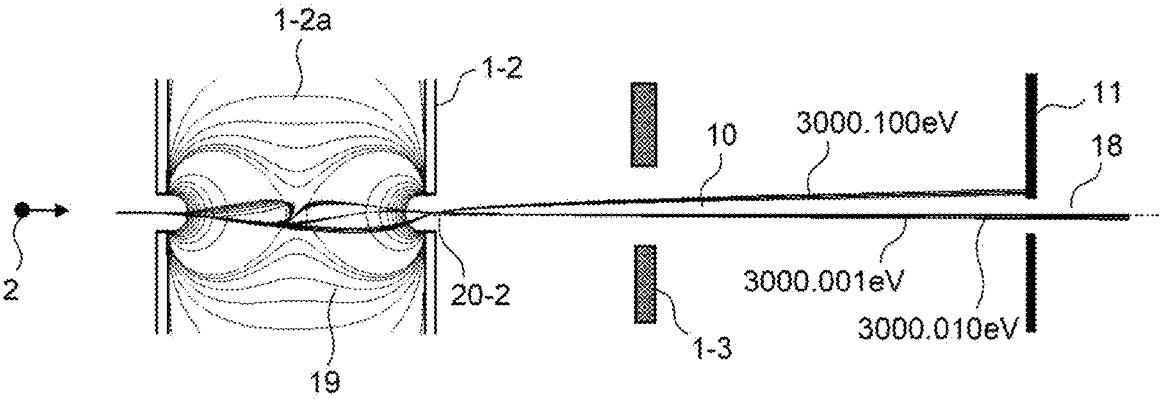
[FIG. 10B]
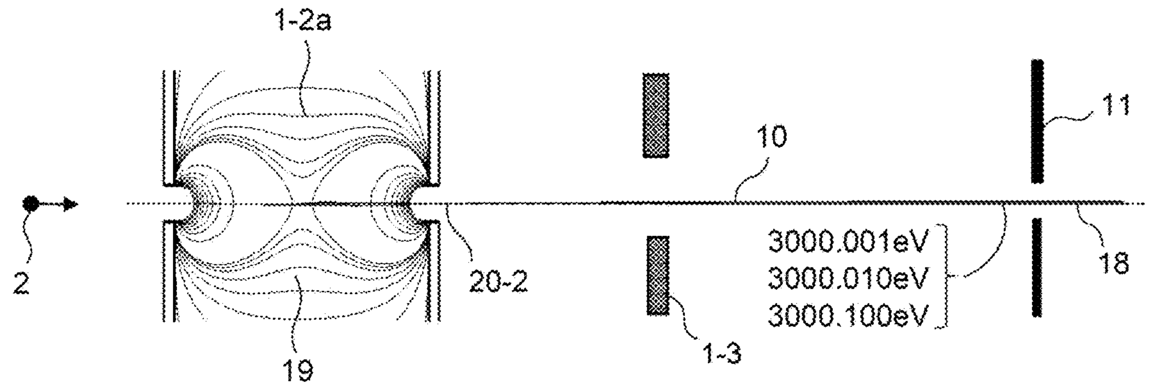

[FIG. 11]
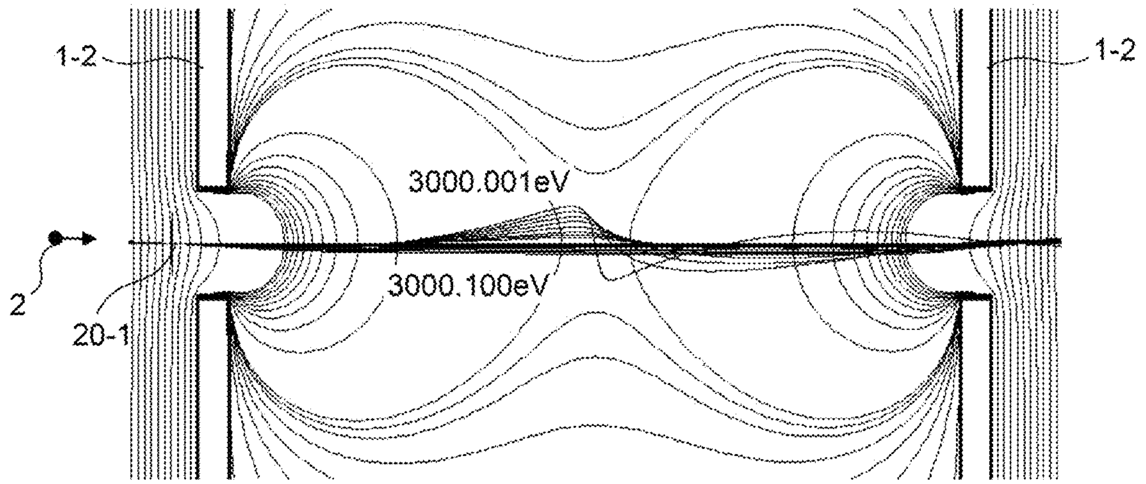
[FIG. 12]
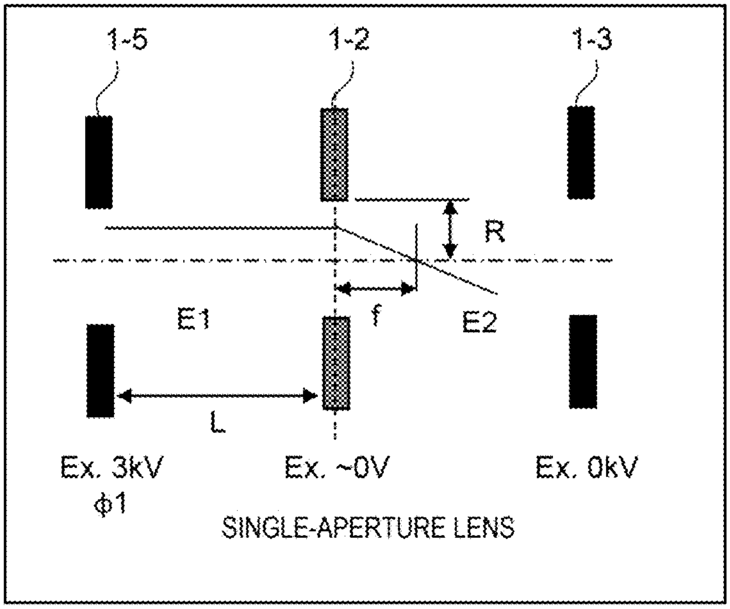

[FIG. 13]
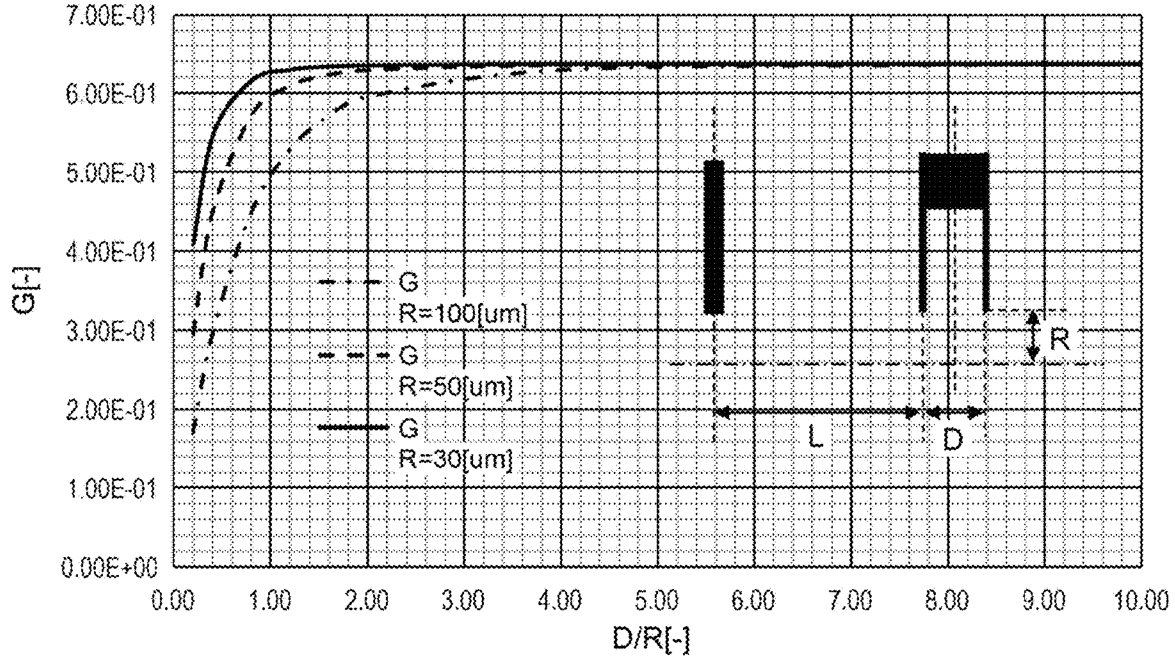

[FIG. 14A]
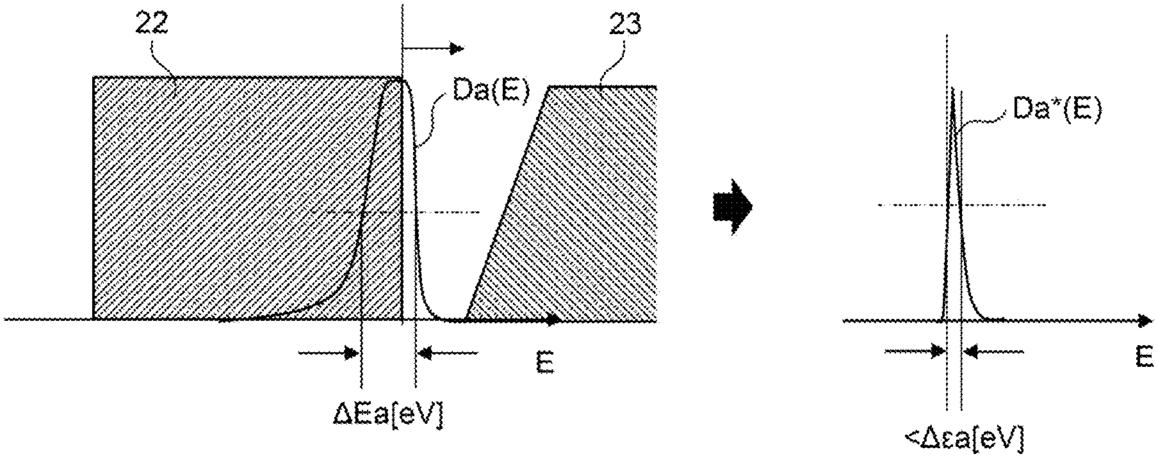
[FIG. 14B]
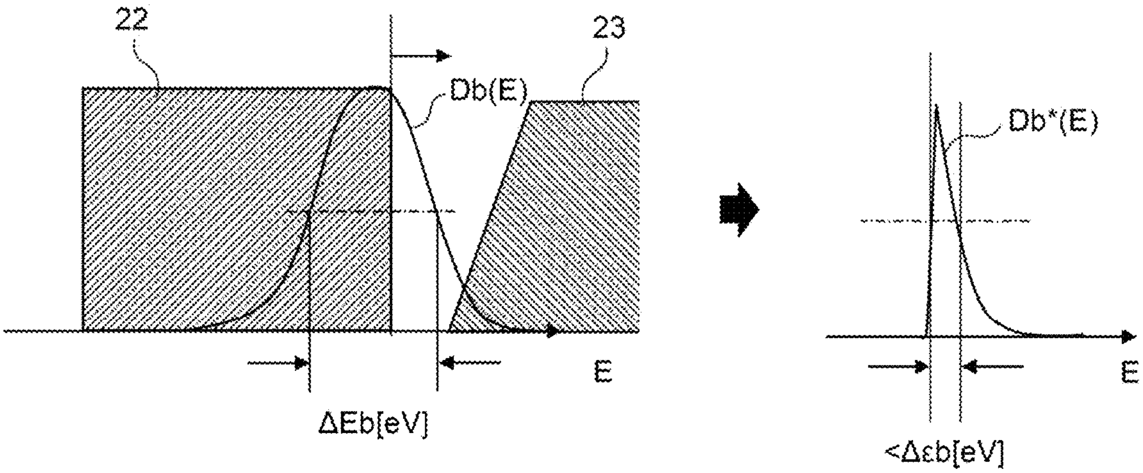

[FIG. 15A]
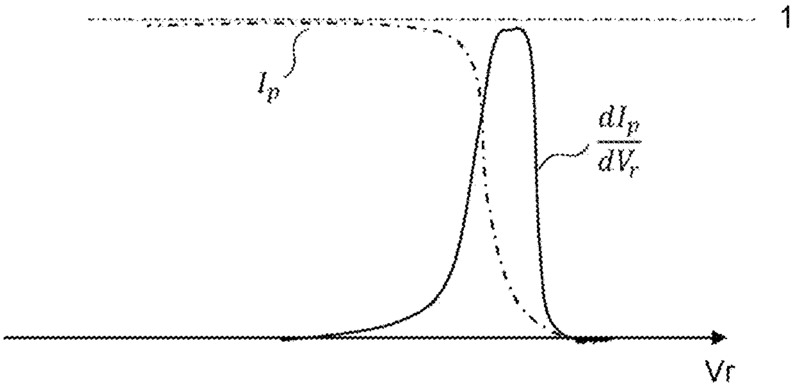
[FIG. 15B]
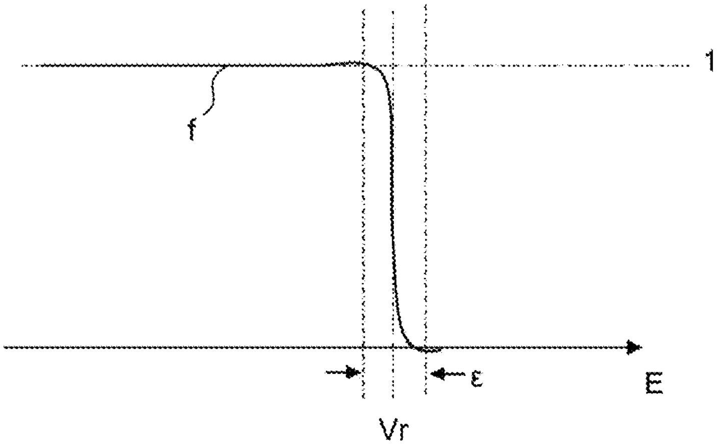

[FIG. 16]
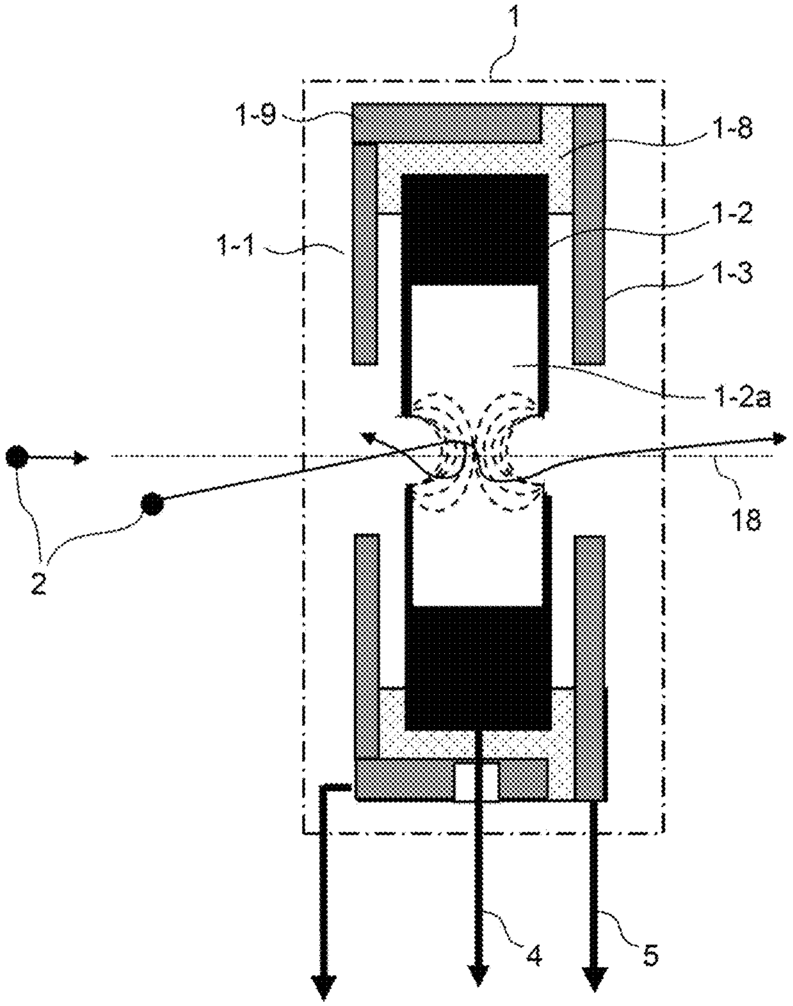

[FIG. 17]
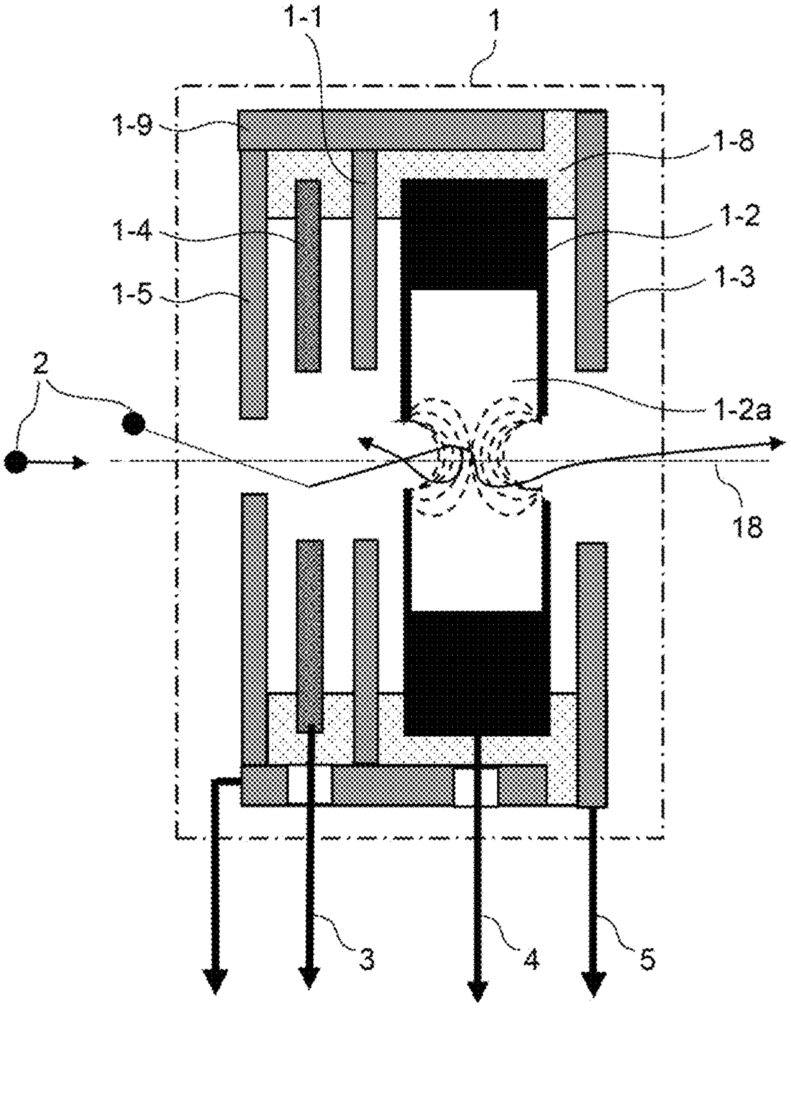

[FIG. 18]
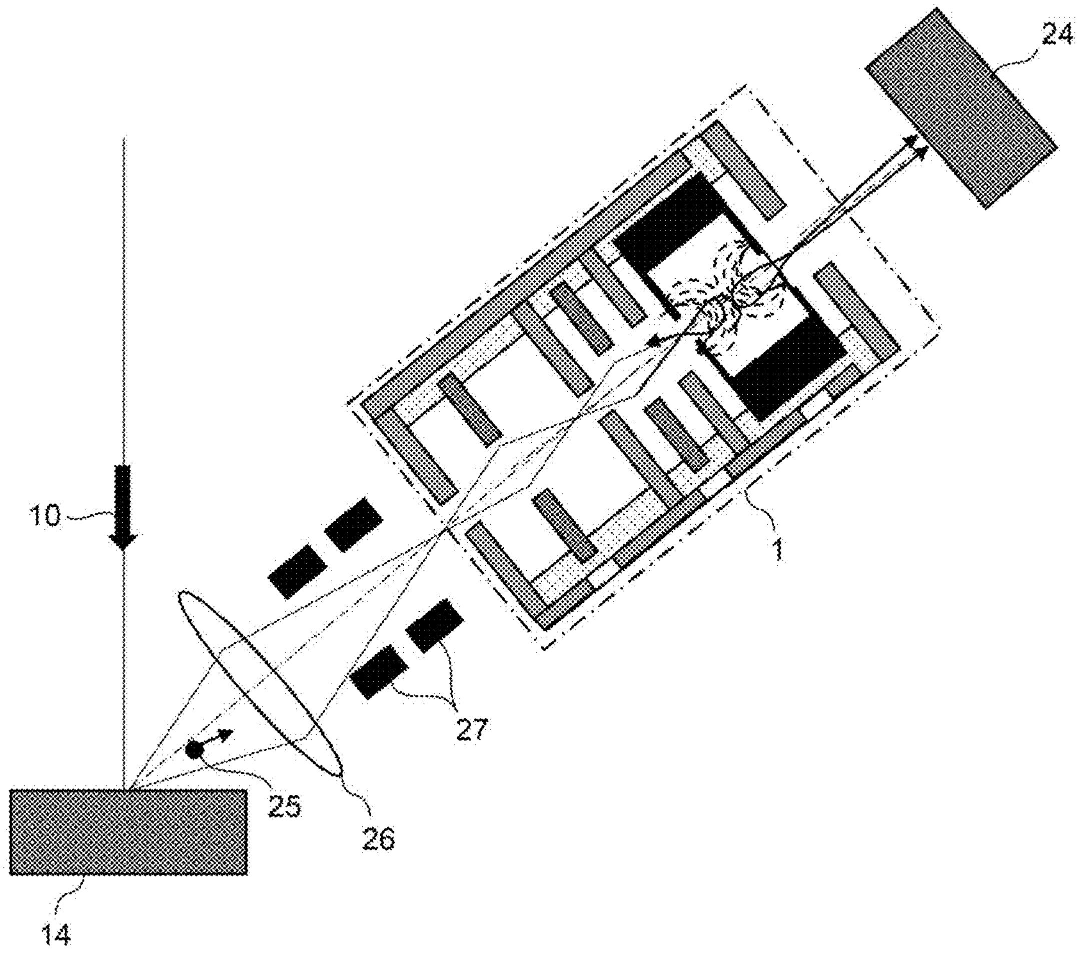

ENERGY FILTER, AND ENERGY ANALYZER AND CHARGED PARTICLE BEAM DEVICE PROVIDED WITH SAME

TECHNICAL FIELD

The present disclosure relates to an energy filter, and an energy analyzer and a charged particle beam apparatus including the energy filter.

BACKGROUND ART

Devices that analyze or image sample information by irradiating a sample with charged particles include, for example, a scanning electron microscope (hereinafter SEM) and a transmission electron microscope (hereinafter TEM). The performance of the device is mainly determined by characteristics of a charged particle beam emitted from a charged particle source, and an example of this is energy dispersion (hereinafter, ΔE: also referred to as energy resolution. Energy dispersion refers to a phenomenon in which energy varies, and energy resolution indicates characteristics of the device) of the charged particle beam. When ΔE is large, beam blur occurs as chromatic aberration when the charged particle beam is focused by an electron lens. Therefore, charged particle sources with small ΔE and low-aberration electron lenses that reduce chromatic aberration have been developed. Since ΔE increases due to heat, a cold cathode electron source that operates a charged particle source at room temperature and an aberration correction lens that electronically corrects chromatic aberration have been developed. However, these stable operating conditions are severe, and it is becoming difficult to stably obtain a smaller ΔE that is required today.

As another technique, there is a technique of making a charged particle beam emitted from a charged particle source incident on an energy filter and forming an energy-separated charged particle beam. Examples of the technique include the Wien filter and the omega filter. These combine a magnetic field and an electric field to generate energy dispersive trajectories of charged particles on an optical axis. The optical axis is straight or curved and combines a magnetic field and an electric field. Therefore, a device configuration is complicated, and it is not always easy to use. Therefore, from a viewpoint of simplicity, a deceleration type energy filter has been used conventionally.

FIG. 1 is a view illustrating a configuration example of a deceleration type energy filter of the related art. An energy filter has a decelerating electrode in a center, and the decelerating electrode is interposed between electrodes of the same potential on both sides in an optical axis. A voltage having the same potential as incident charged particles is applied to the electrodes arranged on both sides of the optical axis. A voltage that resists energy of the charged particles is applied to the decelerating electrode. These electrodes act as a high-pass filter allowing only charged particles with energy greater than a set voltage set from the deceleration power supply to pass. Therefore, the deceleration type energy filter does not operate as a bandpass filter like the Wien filter and the omega filter. Thus, a structure is simple although the uses are different. Also, the deceleration type energy filter can easily obtain an energy spectrum by scanning a deceleration voltage and differentiating a measured transmission current with the deceleration voltage.

CITATION LIST

Patent Literature

PTL 1: US2010/0187436A
PTL 2: U.S. Pat. No. 8,803,102B
PTL 3: JP2009-289748A

Non Patent Literature

NPL 1: 'Evaluation of electron energy spread in CsBr based photocathodes', J. Vac. Sci. Technol. B 26(6), November/December 2008

NPL 2: 'Performance computations for a high-resolution retarding field electron energy analyzer with a simple electrode configuration', J. Phys. D: Appl. Phys., 14(1981) 769-78

SUMMARY OF INVENTION

Technical Problem

However, although a value of the energy resolution of the deceleration type energy filter is extremely small on the optical axis (high resolution (good)=small resolution value), when potential distribution deviates from the optical axis, it has a gradient, and thus the energy resolution rapidly deteriorates (resolution value increases). As a result, it is extremely difficult to achieve the energy resolution (for example, ΔE=~1 mV) required today. Therefore, incident charged particles need to be incident on the energy filter perpendicularly, and the charged particle source need to be positioned far enough from the energy filter. Therefore, there is a problem that the device becomes huge, and the amount of current that can be incident becomes extremely small, resulting in a long measurement time. Also, since an energy dispersion point is focused on one point on the optical axis, there is also the problem that a density of charged particles increases near zero energy, and the energy dispersion increases due to the Coulomb effect. Furthermore, in a deceleration type lens, a focal point is naturally formed near an opening portion, but when the focal point and the energy dispersion point (zero potential point) are close to each other, incidence conditions become severe as described above. By thickening the decelerating electrode, a distance between the focal point and the energy dispersion point can be slightly increased, but there is a problem that the charged particles start to collide with an inner wall of the electrode, causing contamination of a wall surface and degrading the energy resolution.

In view of such circumstances, the present disclosure proposes a technique for realizing a compact high-resolution energy filter (increasing energy dispersion in a filter) that reduces energy dispersion of a charged particle beam emitted from a charged particle source.

Solution to Problem

As one means for solving the problems described above, the present disclosure proposes an energy filter that suppresses energy dispersion ΔE of a charged particle beam emitted from a charged particle source, the energy filter including, a decelerating electrode having a single-aperture electrode pair with an opening portion, and a cavity portion having a radius larger than a radius of the opening portion, the cavity being rotationally symmetrical about a center of the opening portion as an optical axis, a first electrode provided in front of the decelerating electrode, and a second electrode provided behind the decelerating electrode.

Further features related to the present disclosure will become apparent from the description of the specification and the accompanying drawings. In addition, the aspects of the present disclosure are achieved and attained by means of the elements and combinations of various elements and aspects of the detailed description that follows and the claims that follow.

It should be understood that the descriptions in this specification are merely typical examples and do not limit the scope of claims or application examples of the present disclosure in any way.

Advantageous Effects of Invention

According to the technology of the present disclosure, a small high-resolution energy filter (enlarge energy dispersion inside the filter) that reduces energy dispersion of a charged particle beam emitted from a charged particle source, and an energy analyzer or charged particle beam apparatus equipped with the energy filter can be realized.

BRIEF DESCRIPTION OF DRAWINGS

FIG. 1 is a view illustrating a configuration example of a deceleration type energy filter of the related art.

FIG. 2 is a view illustrating a configuration example of a charged particle beam system 30 according to an embodiment.

FIG. 3 is a cross-sectional view illustrating a configuration example of an energy filter 1 according to the embodiment.

FIG. 4A is a view illustrating a case where electric fields on both sides of a decelerating electrode 1-2 are the same.

FIG. 4B is a view illustrating a case where the electric fields on both sides of the decelerating electrode 1-2 are different.

FIG. 4C is a view illustrating a potential distribution and an electron trajectory when the electric fields on both sides of the decelerating electrode 1-2 are the same.

FIG. 4D is a view illustrating the potential distribution and the electron trajectory when the electric fields on both sides of the decelerating electrode 1-2 are different.

FIG. 5A is a schematic view illustrating a trajectory of a charged particle a2-1 passing near an energy dispersion point 21 in the energy filter of the related art (FIG. 1).

FIG. 5B is a schematic view illustrating a trajectory of a charged particle b2-2 passing near an energy dispersion point 21 in the energy filter 1 of the embodiment.

FIG. 6A is a view illustrating a trajectory of a charged particle 2 incident parallel to the decelerating electrode 1-2 having an electrode cavity 1-2*a*.

FIG. 6B is a view illustrating a trajectory of the charged particle 2 incident parallel to the decelerating electrode 1-2 that does not have the electrode cavity 1-2*a*.

FIG. 6C is a view illustrating a trajectory of the charged particle 2 incident parallel to the decelerating electrode 1-2 that has a thin thickness and does not have the electrode cavity 1-2*a*.

FIG. 6D is a view illustrating a trajectory of the charged particle 2 incident so as to converge on a focal point a20-1 formed in a vicinity of the decelerating electrode 1-2 having the electrode cavity 1-2*a*.

FIG. 6E is a view illustrating a trajectory of the charged particle 2 incident so as to converge on the focal point a20-1 formed in the vicinity of the decelerating electrode 1-2 that does not have the electrode cavity 1-2*a*.

FIG. 6F is a view illustrating a trajectory of the charged particle 2 so as to converge on the focal point a20-1 formed in the vicinity of the decelerating electrode 1-2 that has a thin thickness and does not have the electrode cavity 1-2*a*.

FIG. 7 is a view illustrating an example of an on-axis potential when 0 [V] is applied to the decelerating electrode 1-2 when the charged particle 2 is an electron beam.

FIG. 8 is a view illustrating a trajectory of a charged particle beam 10 from a charged particle source 9 to an exit of the energy filter 1 in the embodiment (when forming the electrode cavity 1-2*a* in the decelerating electrode 1-2).

FIG. 9A is a view illustrating a calculation example of a trajectory of the charged particle 2 when 3000 V is applied to a second electrode 1-5 arranged in front of the decelerating electrode 1-2 and 1500 V is applied to an accelerating electrode 1-3 arranged behind the decelerating electrode 1-2.

FIG. 9B is a view illustrating a calculation example of the trajectory of the charged particle 2 when 3000 V is applied to the second electrode 1-5 and 3000 V is applied to the accelerating electrode 1-3.

FIG. 10A is a view illustrating the trajectory of the charged particle 2 when the charged particle 2 is incident in parallel with an incident offset of 1.5 μm to 2.0 μm from an optical axis 18.

FIG. 10B is a view illustrating the trajectory of the charged particle beam 10 when the charged particle 2 is incident in parallel with an incident offset of 0.15 μm to 0.20 μm from the optical axis 18.

FIG. 11 is a view illustrating a case where a focal length f of a single-aperture electrode on an entrance side of the decelerating electrode 1-2 is set as f, the focal point a20-1 is set upstream of the decelerating electrode 1-2 by a focal point f, and an electron is incident at an angle to converge on the focal point a20-1.

FIG. 12 is a view illustrating a positional relationship and applied voltages of the second electrode 1-5, a single-aperture lens, and the accelerating electrode 1-3.

FIG. 13 is a graph illustrating changes in a value of $G=\Phi z(z=0)/\Phi 1$ with respect to D/R.

FIG. 14A is a view illustrating an operation of a bandpass filter when a cold cathode electron source is assumed as the charged particle source.

FIG. 14B is a view illustrating the operation of the bandpass filter when a Schottky electron source is assumed as the charged particle source.

FIG. 15A is a view illustrating a relationship between current $I_p(V_r)$ and differential $dI_p(V_r)/dV_r$ of $I_p(V_r)$ with respect to $V_r$.

FIG. 15B is a view illustrating a shape (one example) of a transmission function $f(V_r|E)$.

FIG. 16 is a view illustrating a configuration example of a peripheral portion of the decelerating electrode 1-2 according to the embodiment.

FIG. 17 is a view illustrating a configuration example of the energy filter 1 according to the embodiment.

FIG. 18 is a view illustrating a configuration example of a charged particle beam apparatus including the energy filter 1 according to the embodiment.

DESCRIPTION OF EMBODIMENTS

An embodiment relates to a technique of analyzing or imaging specimen information by irradiating a specimen surface with a charged particle beam emitted from a charged particle source using an electron lens.

In a charged particle beam apparatus, it is desired to reduce (increase energy resolution (reduce a value of the energy resolution)) energy dispersion of a charged particle beam, but to do so, it is necessary to increase energy dispersion in an energy filter. To increase the energy dispersion in the energy filter, the size of the energy filter need to be increased. However, in the embodiment, as described above, one of the problems is to reduce the size of the energy filter. Therefore, in the embodiment, a cavity is provided in a decelerating electrode of the energy filter in order to reduce the size of the energy filter and increase the energy dispersion in the energy filter.

The embodiment of the present disclosure will be described below with reference to the accompanying drawings. In the accompanying drawings, functionally identical elements may be labeled with the same numerals. Further, in the drawings used in the following embodiment, even a plan view may be hatched to make the drawing easier to see. Although the accompanying drawings show a specific embodiment and a specific implementation example in accordance with the principles of the present disclosure, but they are for the understanding of the present disclosure and are in no way used to limit the interpretation of the present disclosure. The description in this specification is merely exemplary and is not intended to limit the scope of claims or application of this disclosure in any way.

Although the embodiment is described in sufficient detail to enable those skilled in the art to practice the present disclosure, but it should be understood that other implementations and forms are possible, and that changes in configuration and structure and substitution of various elements are possible without departing from the scope and spirit of the present disclosure. Therefore, the following description should not be construed as being limited to this.

Further, in the description of the embodiment below, an example in which the technique of the present disclosure is applied to a charged particle beam system configured by a scanning type charged particle microscope using a charged particle beam and a computer system will be described. Examples of the scanning type charged particle microscopes include a scanning electron microscope (SEM) using electron beams and a scanning ion microscope using ion beams. Examples of a scanning type electron microscope include an inspection device using a scanning type electron microscope, a review device, a general-purpose scanning type electron microscope, and a sample processing device and a sample analysis device that are equipped with scanning type electron microscopes, and the present disclosure is also applicable to these devices. However, this embodiment should not be interpreted restrictively, and for example, the present disclosure can be applied to charged particle beam apparatuses using charged particle beams such as electron beams and ion beams, and general observation apparatuses.

In the functions, operations, processes, and flows of the embodiment described below, each element and each process will be described mainly with "computer system", "control device", and "ΔE measurement controller" as subjects (subjects of operation), but the description may be made with "charged particle beam system" as the subject (subject of operation).

Configuration Example of Charged Particle Beam System

FIG. 2 is a view illustrating a configuration example of a charged particle beam system 30 according to the embodiment. The charged particle beam system 30 is a device that analyzes or images information of a sample 14 by focusing a charged particle beam onto a surface of the sample 14 using an electron lens and detecting secondary charged particles obtained from the sample 14.

The charged particle beam system 30 includes a charged particle source 9, an aperture 11 for limiting a beam diameter of a charged particle beam 10 emitted from the charged particle source 9, a Faraday cup 15 and an ammeter 16 for measuring the current amount of the charged particle beam 10, at least one electron lens 12 and objective lens 13 for focusing the charged particle beam 10 onto the sample 14, an energy filter 1 for separating the energy of the charged particle beam 10 emitted from the charged particle source 9 on an optical axis 18 between the charged particle source 9 and the aperture 11, a ΔE measurement controller 17 that calculates ΔE based on current values measured from the Faraday cup 15 and the ammeter 16, a secondary electron detector 34 for detecting secondary electrons obtained from the sample 14 by irradiation with the charged particle beam 10, a backscattered electron detector 33 for detecting backscattered electrons obtained from the sample 14 by irradiation with the charged particle beam 10, a control device 32 that controls each component described above, a storage device (memory) 36, and an input/output device 37. A computer system is configured by the control device 32 and the ΔE measurement controller 17.

A voltage 7 is applied to the charged particle source 9 from a first acceleration power supply (not illustrated), and an extraction power supply (not illustrated) is installed on the output voltage of the first acceleration power supply, and further the energy filter 1 is installed on an output voltage 8 of the extraction power supply. The energy filter 1 operates as a high-pass filter for the incident charged particle beam 10 and outputs an energy-separated charged particle beam 10. The energy-separated charged particle beam 10 is incident on the Faraday cup 15 after the beam diameter is restricted by the aperture 11. Then, the ammeter 16 connected to the Faraday cup 15 measures the current amount of the charged particle beam 10 that is subject to energy separation. Also, the ΔE measurement controller 17 controls the voltage applied to a decelerating electrode 1-2 (illustrated in FIG. 2) forming the energy filter 1 via a deceleration power supply 4 based on the measured current amount, thereby making adjustments so that ΔE of the charged particle beam passing through the energy filter 1 is minimized.

After the energy filter 1 has been adjusted, a drive portion (not illustrated) removes the Faraday cup 15 from the optical axis 18. Then, the charged particle beam 10 energy-separated by the energy filter 1 is focused on the sample 14 via the electron lens 12 and the objective lens 13 located downstream. A value ΔE of the energy resolution of the energy-separated charged particle beam is smaller than before being incident on the energy filter 1, and the beam diameter of the charged particle beam 10 focused on the sample 14 becomes smaller.

In the charged particle beam system 30, a deflector (not illustrated) is arranged (for example, arranged around the electron lens and the objective lens 13) on the optical axis 18. The control device 32 scans the charged particle beam 10 over the sample 14 using the deflector. The secondary electron detector 34 and the backscattered electron detector 33 detect secondary electrons and backscattered electrons obtained from the sample 14 in synchronization with the scanning of the charged particle beam 10 over the sample 14. The control device 32 generates an image with high spatial resolution by performing signal-processing on these detection signals. Further, the control device 32 outputs, for example, the generated image to the input/output device 37 and records a series of data and information associated with the above-described signal processing in the storage device 36.

Configuration Example of Energy Filter 1

FIG. 3 is a cross-sectional view illustrating a configuration example of the energy filter 1. The energy filter 1 includes the decelerating electrode 1-2, an accelerating electrode 1-3, a first electrode 1-1, a first focusing electrode 1-4, a second electrode 1-5, a second focusing electrode 1-6, a third electrode 1-7, and an electrode holding material 1-8, which are arranged rotationally symmetrically (because it is a cross-sectional view, those are symmetrical with the optical axis in FIG. 3) about the optical axis 18. The electrode holding material 1-8 is made of an insulator and holds the decelerating electrode 1-2, the accelerating electrode 1-3, the first electrode 1-1, the first focusing electrode 1-4, the second electrode 1-5, the second focusing electrode 1-6, and the third electrode 1-7.

The first electrode 1-1, the second electrode 1-5, and the third electrode 1-7 are connected to a shield 1-9 and have the same potential. The shield 1-9 is made of a material (permalloy, for example) with high magnetic permeability, and shields external magnetic stray fields. Similarly, the first electrode 1-1, the second electrode 1-5, and the third electrode 1-7 may also be made of a material (permalloy, for example) with high magnetic permeability. The first focusing electrode 1-4 is insulated from the other electrodes and forms an electrostatic lens together with the first electrode 1-1 and the second electrode 1-5. Similarly, the second focusing electrode 1-6 is also insulated from the other electrodes and forms an electrostatic lens together with the second electrode 1-5 and the third electrode 1-7. Each electrode is disk-shaped and has a hole in a center portion. Further, the electrode holding material 1-8 is configured in a cylindrical shape and holds each electrode inside.

The decelerating electrode 1-2 is provided with a cavity rotationally symmetrical about the optical axis 18 (electrode cavity 1-2*a*). Single-aperture electrodes 1-2-1 and 1-2-2 are formed on both sides of the electrode cavity 1-2*a*, and the diameters of the single-aperture electrodes may be the same or different on both sides. A saddle point, which serves as an energy dispersion point (dispersion surface) 21, is formed by making the deceleration field and the acceleration field in contact inside the electrode cavity 1-2*a*. The position of the saddle point, which serves as an energy dispersion point 21, varies depending on the diameters of the two single-aperture electrodes 1-2-1 and 1-2-2 on both sides forming the electrode cavity 1-2*a* and the strength of the electric fields formed on both sides of the decelerating electrode 1-2. The strength of the electric fields formed on both sides of the decelerating electrode 1-2 may be the same or different.

Potential Distribution and Electron Trajectory in Electrode Cavity 1-2*a* of Decelerating Electrode 1-2

FIG. 4A is a view illustrating a case where the electric fields on both sides of the decelerating electrode 1-2 are the same. FIG. 4B is a view illustrating a case where the electric fields on both sides of the decelerating electrode 1-2 are different. FIG. 4C is a view illustrating the potential distribution and electron trajectory when the electric fields on both sides of the decelerating electrode 1-2 are the same. FIG. 4D is a view illustrating the potential distribution and electron trajectory when the electric fields on both sides of the decelerating electrode 1-2 are different. In addition, the function as an energy filter does not change even when the single-aperture electrode diameter is asymmetric or the strength of the electric field is asymmetric. In the following description, it is assumed that the diameters of the two single-aperture electrodes are the same and the strengths of the electric field on both sides are also the same.

Since the energy dispersion point 21 is located (inside the electrode cavity 1-2*a*) farther than the entrance of the energy filter 1, it has a large cross-sectional area for passing charged particles of the same potential or higher, and can improve energy resolution.

FIG. 5A is a schematic view illustrating a trajectory of a charged particle a2-1 passing near the energy dispersion point 21 in the energy filter of the related art (FIG. 1). FIG. 5B is a schematic view illustrating a trajectory of a charged particle b2-2 passing near the energy dispersion point 21 in the energy filter 1 of the embodiment. Equipotential lines a19-1 in FIG. 5A are the equipotential distribution when (an example of the related art) the thickness of the decelerating electrode 1-2 is thin and the electrode cavity 1-2*a* is not formed. This equipotential distribution is formed near an entrance opening portion of the decelerating electrode 1-2. On the other hand, equipotential lines b19-2 in FIG. 5B are the equipotential distribution when (the embodiment) the electrode cavity 1-2*a* is formed in the decelerating electrode 1-2. This equipotential distribution is formed in a portion (approximately at the center portion of the decelerating electrode 1-2) far from the entrance opening portion of the decelerating electrode 1-2.

In both the example of the related art and the embodiment, the deceleration potential applied to the decelerating electrode 1-2 causes the charged particle 2 (charged particle a2-1 and charged particle b2-2) to have a focal point a20-1 near the entrance opening portion of the decelerating electrode 1-2. When the electrode cavity 1-2*a* is not provided (FIG. 5A), the energy dispersion point 21 is formed near the focal point a20-1, and the equipotential lines a19-1 are also dense at the energy dispersion point 21. Therefore, when the charged particle beam a2-1 is incident away from the optical axis 18, the charged particles that are repelled by the equipotential line a19-1 cannot pass downstream, and only incident charged particles that do not depart from the optical axis 18 can pass downstream (the exit of the energy filter 1). On the other hand, in the case of having the electrode cavity 1-2*a* (FIG. 5B), the energy dispersion point 21 is formed at a distance of a focal point a20-2, and the equipotential line b19-2 is also coarse and dense at the energy dispersion point 21. Therefore, even when the charged particle beam b2-2 is incident away from the optical axis 18, it can pass downstream without being repelled by the equipotential line b19-2.

Calculation Result Example of Trajectory of Charged Particle 2 incident on Decelerating Electrode 1-2

FIGS. 6A to 6F are views illustrating calculation result examples of the trajectory of the charged particle 2 incident on the decelerating electrode 1-2. FIG. 6A is a view illustrating the trajectory of the charged particle 2 incident parallel to the decelerating electrode 1-2 having the electrode cavity 1-2*a*. FIG. 6B is a view illustrating the trajectory of the charged particle 2 incident parallel to the decelerating electrode 1-2 that does not have the electrode cavity 1-2*a*. FIG. 6C is a view illustrating the trajectory of the charged particle 2 incident parallel to the decelerating electrode 1-2 that has a thin thickness and does not have the electrode cavity 1-2*a*. FIG. 6D is a view illustrating the trajectory of the charged particle 2 incident so as to converge on a focal point a20-1 formed in the vicinity of the decelerating electrode 1-2 having the electrode cavity 1-2*a*. FIG. 6E is a view illustrating the trajectory of the charged particle 2 incident so as to converge on the focal point a20-1 formed in the vicinity of the decelerating electrode 1-2 that does not have the electrode cavity 1-2*a*. FIG. 6F is a view illustrating the trajectory of the charged particle 2 incident so as to converge on the focal point a20-1 formed in the vicinity of the decelerating electrode 1-2 that has a thin thickness and does not have the electrode cavity 1-2*a*. In either case, the opening diameter of the decelerating electrode 1-2 is the same.

In the case of parallel incidence, the charged particle 2 is offset from the optical axis 18 by 0.1 μm to 5 μm, and the incident energy of the charged particle 2 is 3000.001 V. In the case of focused incidence, the focal point a20-1 is formed to be in 32 μm away from the upstream side (the entrance side of the decelerating electrode 1-2) of the decelerating electrode 1-2, and the angle toward the focal point a20-1 is varied from 0.5 mrad to 7.8 mrad, and further the incident energies of the charged particles 2 are set at 3000.001 V and 3000.01 V.

A voltage is applied to the decelerating electrode 1-2 so that the charged particle 2 of 3000.000 V that is incident parallel to the optical axis 18 is repelled for each incident condition (0.1 μm to 5 μm offset from the optical axis 18 for parallel incidence, 0.5 mrad to 7.8 mrad angle to focal point a20-1 for focused incidence). That is, a voltage having approximately the same potential as the voltage applied to the charged particle source 9 is applied to the decelerating electrode 1-2 to cancel the accelerated energy. Since there is usually an offset between the potential applied to the decelerating electrode and the potential on the optical axis, a negative (negative polarity) voltage is applied when the charged particle beam is an electron beam or a negative ion beam (for example, $B_2^-$-ion beam, $H^-$ ion beam), and a positive (positive polarity) voltage is applied when the charged particle beam is a positive ion beam (for example, $Ga^+$ ion beam, $Ne^+$ ion beam, $He^+$ ion beam).

As can be seen from the calculation results of FIGS. 6A to 6F, when the electrode cavity 1-2*a* is provided in the decelerating electrode 1-2, the energy dispersion in the energy filter 1 can be increased. As a result, it is possible to reduce the energy dispersion of the output charged particle beam.

Potential on Optical Axis and Condition for passing Charged Particle 2 through Decelerating Electrode FIG. 7 is a view illustrating an example of an on-axis potential when 0 [V] is applied to the decelerating electrode 1-2 when the charged particle 2 is an electron beam. Even when 0 [V] is applied to the decelerating electrode 1-2, the electric fields existing on both sides of the decelerating electrode 1-2 interfere with each other, causing an offset in the on-axis potential. In FIG. 7, Φ(0,0) V is an offset.

TABLE 1

| Conditions under which charged particles with ΔE = 1 mV can pass | Parallel incidence Allowable off-axis from optical axis | Focused incidence Convergence allowable convergence angle at 32 μm on upstream side of decelerating electrode |
|---|---|---|
| (a) Electrode with electrode cavity | ≤2.4 μm | ≤7.8 mrad |
| (b) Electrode without electrode cavity | ≤0.4 μm | ≤2.2 mrad |
| (c) No electrode cavity and thin electrode | ≤0.3 μm | ≤0.5 mrad |

Table 1 is a table illustrating calculation result examples of an incident condition under which the charged particle 2 with an energy difference of 1 mV can pass through the decelerating electrode 1-2. In the case of parallel incidence, as illustrated in Table 1(a), when the electrode cavity 1-2 is provided, the charged particle beam 10 can be energy-selected with an energy resolution ΔE=1 mV even under an incidence condition (2.4 μm offset) having offset from the optical axis 18 by six to eight times compared to the case without the electrode cavity 1-2.

As illustrated in FIG. 6C and Table 1(c), it can be seen that when a thin decelerating electrode of the related art is used, the energy resolution ΔE=−1 mV cannot be measured unless the incidence condition is parallel to the optical axis 18 with an offset of 0.3 μm or less. In addition, as illustrated in FIG. 6E and Table 1(b), by setting the incident condition to a convergent incident condition, the maximum allowable incident angle can be reduced to 2.2 mrad or less when the thickness is thick but the electrode cavity 1-2 is not provided. Further, as illustrated in FIG. 6D and Table 1(b), the maximum allowable incident angle can be 7.8 mrad when the electrode cavity 1-2 is provided. However, as illustrated in FIG. 6C and Table 1(c), little improvement can be achieved for the thin electrode. This is because the distance between the focal point a20-1 and the energy dispersion point 21 is short as illustrated in FIGS. 5A and 5B.

As illustrated in FIG. 6B and Table 1(b), and FIG. 6E and Table 1(b), when the electrode cavity 1-2*a* is not provided, even with the parallel incidence or the focused incidence, the charged particle 2 collides with an inner wall of the decelerating electrode 1-2 and cannot pass through the decelerating electrode 1-2. In particular, the energies of the charged particles 2 are set at 3000.001 V and 3000.01 V for focused incidence. As illustrated in FIG. 6D, when the electrode cavity 1-2 is provided, electrons with either energy can pass through, but electrons with an energy of 3000.1 V would have collided with the wall when the electrode cavity 1-2 is not provided, as illustrated in FIG. 6E. Therefore, in order to detect electrons with uniform energy, the incident angle need to be limited, and the maximum incident angle is 2.2 mrad.

Arrangement Condition of First Focusing Electrode 1-4

FIG. 8 is a view illustrating a trajectory of the charged particle beam 10 from the charged particle source 9 to the exit of the energy filter 1 in the embodiment (when forming the electrode cavity 1-2*a* in the decelerating electrode 1-2).

In FIG. 8, the third electrode 1-7 is applied with a voltage (for example, several kV) for extracting the charged particle beam 10 from the charged particle source 9, and operates as an extraction electrode. The charged particle beam 10 emitted from the charged particle source 9 is limited by a limiting aperture (not illustrated) attached to the third electrode 1-7, and only part of the charged particle beam 10 is transmitted downstream. The transmitted charged particle beam 10 has a focal point between the second electrode 1-5 and the first focusing electrode 1-4 due to the voltage (for example, several hundred V) applied to the second focusing electrode 1-6. Then, the charged particle beam 10 has the focal point a20-1 near the entrance opening portion of the decelerating electrode 1-2 due to a voltage (for example, several hundred V) applied to the first focusing electrode 1-4. The focusing action is not only the focusing action by the voltage applied to the first focusing electrode 1-4, but also the lens action of the decelerating electric field formed between the first electrode 1-1 and the decelerating electrode 1-2. After passing through the focal point a20-1, the charged particles forming the charged particle beam 10 are dispersed at the energy dispersion point 21 according to their energies and incident conditions.

As illustrated in FIGS. 6A to 6F and Table 1, the energy resolution of the energy filter 1 easily varies depending on the conditions of incidence on the decelerating electrode 1-2. The focusing lens including of the first electrode 1-1, the first focusing electrode 1-4, and the second electrode 1-5 illustrated in FIGS. 3 and 8 is means for stabilizing the incident condition of the charged particle beam 10 to the decelerating electrode 1-2, and controls the incident angle according to the required energy resolution. Further, as illustrated in FIGS. 5A to 6F, the smaller the incident angle, the higher the energy resolution. Therefore, the first focusing electrode 1-4 is arranged between a distance L1*a*, which is the distance between the focal point between the second electrode 1-5 and the first focusing electrode 1-4 and the center of the first focusing electrode 1-4, and a distance L1*b*, which is the distance between the center of the first focusing electrode 1-4 and the focal point a20-1 formed at the entrance opening portion of the decelerating electrode 1-2 so as to satisfy L1*a*<L1*b*, so that the angular magnification of the focusing lens including the first electrode 1-1, the first focusing electrode 1-4, and the second electrode 1-5 becomes small.

Difference in Trajectory of Charged Particle 2 due to Difference in Voltage applied to Second Electrode 1-5

FIG. 9 is a view illustrating differences in trajectories of the charged particles 2 due to differences in voltages applied to the second electrode 1-5. FIG. 9A is a view illustrating a calculation example of the trajectory of the charged particle 2 when 3000 V is applied to the second electrode 1-5 arranged in front of the decelerating electrode 1-2 and 1500 V is applied to the accelerating electrode 1-3 arranged behind the decelerating electrode 1-2. FIG. 9B is a view illustrating a calculation example of the trajectory of the charged particle 2 when 3000 V is applied to the second electrode 1-5 and 3000 V is applied to the accelerating electrode 1-3. As for the incident conditions of the charged particles 2, both are parallel incident with an offset amount from the optical axis 18 of 1.5 μm to 2.0 μm, and the energies of the charged particles 2 are 3000.000 V, 3000.001 V, 3000.010 V, and 3000.100 V. Further, the decelerating electrode 1-2 is set so as to repel the charged particles 2 having an energy of 3000.000V.

As illustrated in FIG. 9A, when 1500 V is applied to the accelerating electrode 1-3, only charged particles of 3000.100 V pass through. This is because the charged particles 2 cannot exceed the potential corresponding to the energy unless they have a certain energy or more. On the other hand, as illustrated in FIG. 9B, when 3000 V is applied to the accelerating electrode 1-3, all the charged particles 2 of 3000.001 V or higher will pass through. Therefore, it can be seen that the energy filter 1 has an energy resolution (separates electrons originally having an energy of 3 kV in units of 1 mV) of 1 mV.

Further, as illustrated in FIG. 9B, equipotential distributions of the decelerating electric field and the accelerating electric field are formed symmetrically about the center of the decelerating electrode 1-2 in the electrode cavity 1-2*a* in the decelerating electrode 1-2. Therefore, the charged particles 2 incident on the decelerating electrode 1-2 are subjected to a focusing action even after taking energy dispersion in the electrode cavity 1-2*a*. The charged particles 2 passing through the energy dispersion point 21 form a focal point b20-2 near the exit opening portion of the decelerating electrode 1-2. The diameter of the charged particle beam formed at the focal point b20-2 is slightly blurred due to aberration, but it is small enough to be used as a charged particle source. Further, as illustrated in FIG. 9B, charged particles with higher energy converge on the focal point b20-2 after deviating from the optical axis 18 in the electrode cavity 1-2*a*. Therefore, the higher the energy of the charged particles 2 that have passed through the focal point b20-2, the more they diverge.

Difference in Trajectory of Charged Particle 2 due to Difference in Incident Offset from Optical Axis FIGS. 10A and 10B are views illustrating the differences in the trajectories of the charged particles 2 due to the differences in the incident offset from the optical axis. FIG. 10A is a view illustrating the trajectory of the charged particle 2 when the charged particle 2 is incident in parallel with the incident offset of 1.5 μm to 2.0 μm from the optical axis 18. The energy of the charged particle 2 is set to 3000.000 V, 3000.001 V, 3000.010 V, and 3000.100 V, and the trajectory of the charged particle beam 10 after passing through the decelerating electrode 1-2 is calculated. Further, the charged particle beam 10 takes a radiation trajectory with the focal point b20-2 as a bright point and the voltage applied to the accelerating electrode 1-3, and it can be seen that the higher the energy of the charged particles 2, the larger the emission angle.

FIG. 10B is a view illustrating the trajectory of the charged particle beam 10 when the charged particle 2 is incident in parallel with an incident offset of 0.15 μm to 0.20 μm from the optical axis 18. Similar to FIG. 10A, the higher the energy of the charged particles 2, the larger the emission angle, but the extent of the increase is small. Therefore, the emission angle of the energy changes depending on the incident angle of the charged particles 2. In other words, the energy filter 1 acts as a high-pass filter with high energy resolution, but the aperture 11 limits the beam diameter and acts as a low-pass filter with a slightly low energy resolution with respect to energy. Then, a bandpass filter can be formed by combining the high-pass filter and the low-pass filter.

Relationship between Focal Point f of Single-aperture Electrode and Radius R of Single-aperture Electrode In FIGS. 9A to 10B, the incident condition of the charged particles 2 incident on the decelerating electrode 1-2 is parallel. However, the incident condition is not limited to parallel, and the focal point a20-1 may be formed near the entrance of the decelerating electrode 1-2 and the focal incident may be performed at an angle to converge on the focal point a20-1. FIG. 11 is a view illustrating a case where a focal length of the single-aperture electrode on the entrance side of the decelerating electrode 1-2 is set as f, the focal point a20-1 is set upstream of the decelerating electrode 1-2 by a focal point f, and an electron is incident at an angle to converge on the focal point a20-1. In this case, electrons travel parallel to a z-axis (optical axis) in the electrode cavity 1-2*a* of the decelerating electrode 1-2. However, electrons with small energies take energy dispersion in the electrode cavity 1-2*a* and are energy-separated at a saddle point formed in the electrode cavity 1-2*a*.

Here, the focal length f of the single-aperture lens can be expressed as the following equation (1) as Davisson Calbick's equation. FIG. 12 is a view illustrating the positional relationship and applied voltages of the second electrode 1-5, the single-aperture lens, and the accelerating electrode 1-3.

[Equation 1]

$$f = \frac{4\phi_z(z=0)}{E_1 - E_2} \quad (1)$$

Here, $\Phi_z$ represents the on-axis potential, and z=0 represents a central position of the single-aperture lens. Assuming that the potential of the second electrode 1-5 is Φ1 kV and the potential of the accelerating electrode 1-3 is 0 kV, an electric field El generated between the second electrode 1-5 and a single-aperture lens (single-aperture electrode in a previous stage) is Φ1/L, and an electric field E2 generated between a single-aperture lens (single-aperture electrode in a subsequent stage) and the accelerating electrode 1-3 is zero. Then, Equation (1) becomes the following equation (2).

[Equation 2]

$$f = 4\frac{\phi_z(z=0)}{\phi_1}L \quad (2)$$

On the other hand, when the dimension of the system is determined, Φ(z=0)=G*Φ1 is satisfied (G=Φz(z=0)/Φ1) and it can be expressed as f=4G*L (G is a coefficient). When 4G*L is calculated numerically, 4G*L=0.64R is satisfied. When a distance (width of the decelerating electrode 1-2: electrode width) between the entrance side and the exit side of the decelerating electrode 1-2 is set to D, when the dimension of the decelerating electrode 1-2 is D/R≥5, the focal length f does not depend on the dimension of the system, but only on a radius R of the single-aperture electrode, and can be expressed as f=λR, λ=0.64±0.05 (λ: dimensionless coefficient). Here, 0.05 is a numerical value indicating an empirical difference (error) between devices.

FIG. 13 is a graph illustrating changes in the value of G=Φz(z=0)/Φ1 with respect to D/R. From FIG. 13, it can be seen that when D/R≥5, the value of G converges to 0.64 regardless of each value of an electrode width D of the decelerating electrode 1-2, an opening radius R of the decelerating electrode 1-2, and a distance L between the decelerating electrode 1-2 and the second electrode 1-5. Therefore, when G=0.64, the focal length f of the single-aperture lens is stable without fluctuation.

Operation of Bandpass Filter

FIGS. 14A and 14B are views illustrating the operation of the energy filter 1 as a bandpass filter. In FIGS. 14A and 14B, a horizontal axis E indicates energy, and a vertical axis indicates the number of charged particles in the charged particle beam 10 normalized to '1'. FIG. 14A is a view illustrating the operation of the bandpass filter when a cold cathode electron source is assumed as the charged particle source. In this case, the energy spectrum of the cold cathode electron source has a shape (Da(E)) in which the energy spectrum sharply decreases on the high energy side and gently attenuates on the low energy side. This is because the cold-cathode electron source operates at room temperature, and electrons at the Fermi level are emitted without being scattered because they pass through the energy barrier by the tunnel effect, and electrons with lower energies are emitted after being scattered.

Further, as illustrated in FIG. 14A, since a high-pass filter 22 based on the energy filter 1 has a high energy resolution, it can shield electrons on the sharply low-energy side. On the other hand, a low-pass filter 23 based on the aperture 11 has slightly low energy resolution as described above. However, as illustrated in FIG. 14A, since the energy spectrum on the high-energy side of the cold cathode electron source is sharp, when the high-pass filter 22 is adjusted to the energy that changes sharply, even in a region (because the low-pass filter 23 is formed by the aperture 11, there is a non-operation region in the slope portion of the low-pass filter 23) where the low-pass filter 23 does not operate, regardless of the presence or absence of the low-pass filter, the energy spectrum Da(E) can be converted into an energy spectrum Da*(E) with a small ΔE (Δϵa).

FIG. 14B is a view illustrating the operation of the bandpass filter when a Schottky electron source is assumed as the charged particle source. Since the Schottky electron source is heated at about 1800 K, its energy spectrum Db(E) is wider than that of the cold cathode electron source. With a broad energy spectrum, as illustrated in FIG. 14B, the low-pass filter 23 operates also on the high energy side, and the energy spectrum Db(E) can be converted into an energy spectrum Db*(E) with a small ΔE (Δϵb).

When Operating Energy Analyzer

When measuring the energy dispersion ΔE of the charged particle beam 10 emitted from the charged particle source 9 using an energy analyzer 31 (see FIG. 2) including the energy filter 1, the aperture 11 is removed from the optical axis 18 (using a drive portion not illustrated), and the Faraday cup 15 is placed on the optical axis 18 (using a drive portion not illustrated). Then, the ΔE measurement controller 17 controls, to appropriate values, a voltage 6 from a second focusing power supply applied to the second focusing electrode 1-6, a voltage 3 from a first focusing power supply applied to the first focusing electrode 1-4, a voltage 4 from the deceleration power supply applied to the decelerating electrode 1-2, and a voltage 5 from an acceleration power supply applied to the accelerating electrode 1-3, so that the charged particle beam 10 satisfies the above-mentioned condition (see Table 1) of incidence on the energy filter 1.

Operation of ΔE Measurement Controller 17

Here, the operation and action of the ΔE measurement controller 17 will be described in detail. As illustrated in FIG. 2, the output voltage 8 (several kV) of the extraction power supply is applied to the third electrode 1-7 (see FIG. 3). For example, the charged particle source 9 is applied with the voltage 7 (−3000.000 V) from the first acceleration power supply. +3000.000 V is applied to the third electrode 1-7 as the output voltage 8 of the extraction power supply. In this case, the GND potential becomes a potential of +3000.000 V when viewed from the charged particle source 9. Further, the energy of the charged particle beam 10 extracted by the output voltage 8 (+3000.000 V) of the extraction power supply is also +3000.000 V when viewed from the charged particle source 9. Therefore, when an appropriate voltage Vr is applied to the decelerating electrode 1-2 and a potential barrier of −3000.000 V is formed on the optical axis 18 near the center of the electrode cavity 1-2$a$, the charged particles 2 with energies less than +3000.000 V are all repelled by the potential barrier.

Since the charged particle beam 10 that has passed through the energy filter 1 travels straight to the Faraday cup 15 that has the same potential as the energy filter 1, the charged particle beam 10 is all detected by the Faraday cup 15. Therefore, a current Ip(Vr) detected by the Faraday cup 15 becomes a function of the voltage Vr applied to the decelerating electrode 1-2 and is expressed by Equation (3).

[Equation 3]

$$I_p(V_r)=\int_E D(E)\otimes f(V_r|E)dE=\int_E D(E)f(E-V_r)dE \tag{3}$$

In Equation (3), D(E) indicates the energy spectrum of the charged particle beam 10 emitted from the charged particle source 9, and f(Vr|E) indicates the transmittance of the charged particle beam 10 passing through the energy filter 1 when the energy of the charged particle 2 is E and the voltage Vr is applied to the decelerating electrode 1-2. As illustrated in Equation (1), the current Ip(Vr) is represented by the convolution of D(E) and f(Vr|E).

FIG. 15A is a view illustrating the relationship between the current Ip(Vr) and the differential dlp(Vr)/dVr of Ip(Vr) with respect to Vr. From FIG. 15A, it can be seen that the charged particle beam 10 is all transmitted through the energy filter 1 when the deceleration voltage Vr is small for the charged particle beam 10 with the energy E, but when the deceleration voltage Vr approaches a certain value, part of the charged particle beam 10 cannot be transmitted, and above a certain value, all of the charged particle beam 10 is repelled. The following equation (4) is an equation showing the differentiation of Ip(Vr).

[Equation 4]

$$\frac{dI_p(V_r)}{dV_r}=D_\varepsilon(E)=D(E)|_{|\varepsilon|\to 0} \tag{4}$$

The differentiation of Ip(Vr) shows the energy distribution Dϵ(E) of the charged particles, but the shape of the energy distribution Dϵ(E) depends on the shape of the transmission function f(Vr|E).

FIG. 15B is a view illustrating the shape (one example) of the transmission function f(Vr|E). According to FIG. 15B, it can be seen that the transmission function f(Vr|E) becomes f(Vr|E)=1 when the energy E is sufficiently smaller than Vr, but attenuates in the vicinity of Vr, and becomes f(Vr|E)=0 when the energy E is sufficiently larger than Vr. Further, the observed energy spectrum Dϵ(E) is determined by the magnitude of the attenuation width ϵ in the vicinity of Vr. As illustrated in Equation (4), Dϵ(E) is equal to the energy spectrum D(E) of the charged particle beam 10 when the attenuation width ϵ is sufficiently small. Therefore, in order to accurately measure the energy spectrum D(E) of the charged particle beam 10, the energy filter 1 with the small attenuation width ϵ is required.

The attenuation width ϵ of the energy filter 1 according to the embodiment is very small as |ϵ|<1 mV, and the measured energy spectrum Dϵ(E) can be regarded as Dϵ(E)≡D(E).

The energy dispersion ΔE of the charged particle beam 10 can be represented by the full width at half maximum of the energy spectrum Dϵ(E) or D(E). Assuming that the full width at half maximum of Dϵ(E) is the energy dispersion ΔE, the ΔE measurement controller 17 can determine the energy dispersion ΔE by scanning the voltage Vr applied to the decelerating electrode 1-2 and calculating Dϵ(E) from Equations (3) and (4).

When the aperture 11 is not inserted on the optical axis 18, the calculated energy dispersion ΔE can be regarded as the energy dispersion ΔE of the charged particle beam 10 emitted from the charged particle source 9. On the other hand, when the aperture 11 is inserted on the optical axis 18, the charged particle beam passing through the aperture 11 is partially restricted on the high-energy side by the aperture 11, resulting in a smaller value of the energy ΔE.

As described above, the ΔE measurement controller 17 measures the energy dispersion ΔE according to the procedure described above, and adjusts the voltage Vr applied to the decelerating electrode 1-2 so that the value of the energy dispersion ΔE is minimized. The Vr at which the value of the energy dispersion ΔE is minimized is in the vicinity of the Vr at which the differential value of Ip shown in Equation (4) is maximized or at the inflection point. Therefore, the Vr can be set to a value that maximizes the differential value of Ip or to a value that is an inflection point.

Configuration Example of Peripheral Portion of Decelerating Electrode 1-2

FIG. 16 is a view illustrating a configuration example of a peripheral portion of the decelerating electrode 1-2 according to the embodiment. Although the decelerating electrode 1-2 is also illustrated in FIG. 2 and the like, only the configuration of the peripheral portion of the decelerating electrode 1-2 is extracted from the energy analyzer 31 and described again here.

The decelerating electrode peripheral portion includes the decelerating electrode 1-2, the accelerating electrode 1-3, and the first electrode 1-1, which are arranged rotationally symmetrically about the optical axis 18. Each of the decelerating electrode 1-2, the accelerating electrode 1-3, and the first electrode 1-1 is formed of a disk-shaped member having a predetermined width.

The decelerating electrode 1-2, the accelerating electrode 1-3, and the first electrode 1-1 are held by the insulating electrode holding material 1-8. The first electrode 1-1 is connected to the shield 1-9 and has the same potential. The shield 1-9 is made of a material (permalloy, for example) with high magnetic permeability and shields external magnetic stray fields. Similarly, the first electrode 1-1 can also be made of a material (permalloy, for example) with high magnetic permeability.

The decelerating electrode 1-2 has a cavity (electrode cavity 1-2$a$) rotationally symmetrical about the optical axis 18. A plurality of electron lenses are provided between the charged particle source 9 and the decelerating electrode 1-2 (see FIG. 2), and the charged particle beam 10 emitted from the charged particle source 9 is incident on the energy filter 1.

Configuration Example of Energy Filter 1

FIG. 17 is a view illustrating a configuration example of the energy filter 1 according to the embodiment. Although the energy filter 1 is also illustrated in FIG. 2 and the like, only the configuration of the energy filter 1 is extracted from the energy analyzer 31 and described again here.

The energy filter 1 includes the decelerating electrode 1-2, the accelerating electrode 1-3, the first electrode 1-1, the first focusing electrode 1-4, and the second electrode 1-5, which are rotationally symmetrical about the optical axis 18. The decelerating electrode 1-2, the accelerating electrode 1-3, the first electrode 1-1, the first focusing electrode 1-4, and the second electrode 1-5 are held by the insulating electrode holding material 1-8. The first electrode 1-1 and the second electrode 1-5 are connected to the shield 1-9 and have the same potential. The shield 1-9 is made of a material (permalloy, for example) with high magnetic permeability and shields external magnetic stray fields. Similarly, the first electrode 1-1 and the second electrode 1-5 can also be made of a material (permalloy, for example) with high magnetic permeability.

The decelerating electrode 1-2 has a cavity (electrode cavity 1-2*a*) rotationally symmetrical about the optical axis 18. A plurality of electron lenses are provided between the charged particle source 9 and the energy filter 1 (see FIG. 2), and the charged particle beam 10 emitted from the charged particle source 9 is incident on the energy filter 1.

Configuration Example of Charged Particle Beam Apparatus with Energy Filter 1

FIG. 18 is a view illustrating a configuration example of a charged particle beam apparatus including the energy filter 1 according to the embodiment.

The charged particle beam apparatus in FIG. 18 detects a secondary electron 25 that is emitted from the sample 14 by irradiating the sample 14 with the charged particle beam 10. The charged particle beam 10 emitted from a charged particle source (not illustrated) is focused onto the sample 14 by an electron lens (not illustrated). The secondary electron 25 emitted from the sample 14 is incident on the energy filter 1 via an input lens 26. The charged particles energy-selected by the energy filter 1 are detected by the secondary electron detector 24. An aligner 27 is arranged between the input lens 26 and the energy filter 1, and the secondary electrons 25 are deflected so as to satisfy the incident condition (see Table 1) of the energy filter 1. The charged particle beam 10 incident on the sample 14 is scanned on the sample 14 by a deflector (not illustrated) and finally detected synchronously by the secondary electron detector 24. This makes it possible to obtain an energy-selected secondary electron image.

SUMMARY OF EMBODIMENT (i) According to the energy filter of the embodiment, ΔE of the charged particle beam emitted from the charged particle source having a large value of energy dispersion ΔE can be reduced, and thus a charged particle beam with a reduced ΔE can be focused on the sample more narrowly by the electron lens. Further, a charged particle beam with a small ΔE can be formed without increasing the size of the apparatus. Also, the ΔE of the charged particle beam can be measured with a high energy resolution (for example, ΔE=~several mV), and the performance of the charged particle source can be evaluated. In addition, since the decelerating electrode has a cavity, the energy-dispersed charged particles do not collide with an inner wall of the decelerating electrode. Thus, the inner wall does not become contaminated, and the electric field in the decelerating electrode cavity can be maintained stably. There is no change in the energy resolution over time.

(ii) More specifically, in the energy filter according to the embodiment, a cavity portion having a radius larger than the radius R of the opening portion is provided in a decelerating electrode with a single-aperture electrode pair having an opening portion. By providing such a cavity portion in the decelerating electrode, it is possible to increase the energy dispersion of the charged particle beam in the energy filter. As a result, it is possible to (increase energy resolution (reduce a value of the energy resolution)) reduce the energy dispersion of the charged particle beam output from the energy filter. Further, by providing such a cavity portion, the space inside the decelerating electrode can be increased without increasing the size of the decelerating electrode, and thus it is possible to reduce the size of the energy filter itself, and eventually the size of the energy analyzer and charged particle beam apparatus.

Assuming that the width of the decelerating electrode in the optical axis direction is D, the decelerating electrode is configured so as to have a relationship of D/R≥5. In this way, the relationship between the focal point f of the single-aperture electrode arranged on the entrance side of the charged particle beam in the single-aperture electrode pair of the decelerating electrode and the radius R of the opening portion is expressed by the following equation (5).

[Equation 5]

$$f=\lambda R,\ \lambda=0.64\pm0.05\ (\lambda\text{: dimensionless coefficient}) \tag{5}$$

That is, the focal point f of the single-aperture electrode is a value determined only by the radius R of the opening portion, without depending on the value of the width D of the decelerating electrode. In this case, the electric field generated by applying predetermined potentials to the first electrode (upstream side) and second electrode (downstream side) placed in front of and behind the decelerating electrode protrudes into the cavity portion of the decelerating electrode, and a saddle point (energy dispersion point) of the potential that opposes the energy of the charged particle beam is formed. Also, the energy filter acts as a high-pass filter with high energy resolution that performs energy-selection of the charged particle beam in the vicinity of the optical axis that intersects the saddle point.

The energy filter has a focusing lens system including a plurality of focusing lenses. The focusing lens system includes at least two stages of focusing lenses and has an intermediate focal point between the two stages of focusing lenses. Of the two stages of focusing lenses, the focusing lens (second focusing electrode 1-6) on the upstream side located closer to the charged particle source forms a reduction system having the charged particle source as an object point and an intermediate focal point as an image point. On the other hand, Of the two stages of focusing lenses, the focusing lens (first focusing electrode 1-4) on the downstream side located far from the charged particle source forms a magnifying system having an intermediate focal point as an object point and a focal point formed near the entrance of the decelerating electrode as an image point. In this case, the downstream-side focusing lens (first focusing electrode 1-4) is arranged so that the relationship between the distance L1*a* between the intermediate focal point and the downstream-side focusing lens and the distance L1*b* between the downstream-side focusing lens and the focal point of the focusing lens system satisfies L1*a*<L1*b*. This makes it possible to reduce the angular magnification of the focusing lens system, thereby reducing the incident angle of the charged particle beam to the decelerating electrode. As a result, it is possible to increase the energy resolution of the charged particle beam.

The voltage applied to the first electrode (first electrode 1-1) is set equal to the accelerating voltage of the charged particle beam, but the voltage applied to the second electrode (accelerating electrode 1-3) can be variable. By controlling the voltage applied to the second electrode, it is possible to realize an energy filter that separates the charged particle beam with a resolution of 1 mV.

(iii) The energy filter can be incorporated into an energy analyzer. In this case, the energy analyzer includes, in addition to an energy filter, a Faraday cup arranged behind the energy filter, an ammeter that measures the current amount of the charged particle beam that flows into the Faraday cup, and a ΔE measurement controller that calculates the value of the energy dispersion ΔE of the charged particle beam based on the current amount. Then, the ΔE measurement controller executes a process of measuring the differential value from the current amount Ip(Vr) measured by the ammeter when the voltage Vr is applied to the decelerating electrode and a process of calculating the full width at half maximum of the spectrum indicated by the differential value of the current amount Ip(Vr) with respect to the voltage Vr as the value of the energy dispersion ΔE of the charged particle beam, and applies, to the decelerating electrode, the voltage Vr at which the differential value of the current amount Ip(Vr) is maximized or the voltage Vr at which the current amount Ip(Vr) is at an inflection point.

(iv) The energy filter or energy analyzer according to the embodiment can be applied to a charged particle beam apparatus such as SEM, TEM, STEM, AUGER, FIB, PEEM, and LEEM.

(iv) Although the embodiments are described above, these embodiments are presented as examples and are not intended to limit the scope of the claims presented below. These novel embodiments can be implemented in various other forms, and various omissions, replacements, and modifications can be made without departing from the spirit of the technology of the present disclosure. These embodiments and their modifications are included in the technical scope and gist of the present disclosure, and are included in the scope of invention described in the claims and their equivalents.

REFERENCE SIGNS LIST

1: energy filter
1-1: first electrode
1-2: decelerating electrode
1-3: accelerating electrode
1-4: first focusing electrode
1-5: second electrode
1-6: second focusing electrode
1-7: third electrode
1-8: electrode holding material
2: charged particle
2-1: charged particle a
2-2: charged particle b
3: voltage from first focusing power supply
4: voltage from decelerating power supply
5: voltage from second acceleration power supply
6: voltage from second focusing power supply
7: voltage from first acceleration power supply
8: output voltage of extraction power supply
9: charged particle source
10: charged particle beam
11: aperture
12: electron lens
13: objective lens
14: sample
15: Faraday cup
16: ammeter
17: ΔE measurement controller
18: optical axis
19: equipotential line
19-1: equipotential line a
19-2: equipotential line b
20: focal point
20-1: focal point a
20-2: focal point b
21: energy dispersion point
22: high-pass filter
23: Low-pass filter
24, 34: secondary electron detector
25: secondary electron
26: input lens
27: aligner
30: charged particle beam system
31: energy analyzer
32: control device
33: backscattered electron detector
35: computer system
36: storage devices
37: input/output device

The invention claimed is:

1. An energy filter that suppresses energy dispersion ΔE of a charged particle beam emitted from a charged particle source, the energy filter comprising:
- a decelerating electrode having a single-aperture electrode pair with an opening portion, and a cavity portion having a radius larger than a radius of the opening portion, the cavity being rotationally symmetrical about a center of the opening portion as an optical axis;
- a first electrode provided in front of the decelerating electrode; and
- a second electrode provided behind the decelerating electrode.

2. The energy filter according to claim 1, wherein when a width of the decelerating electrode in an optical axis direction is D, and a radius of the opening portion is R, the decelerating electrode has a relationship of $D/R \geq 5$.

3. The energy filter according to claim 1, wherein the energy filter is configured to apply a predetermined potential to each of the first electrode and the second electrode which produces an electric field that protrudes into the cavity portion, and a saddle point of potential that opposes energy of the charged particle beam is formed.

4. The energy filter according to claim 3, wherein the energy filter acts as a high-pass filter that performs energy-selection of the charged particle beam in a vicinity of the optical axis that intersects the saddle point.

5. The energy filter according to claim 1, further comprising:
- a focusing lens system that is disposed between the charged particle source and the first electrode and forms a focal point of the charged particle beam near an entrance of the decelerating electrode.

6. The energy filter according to claim 5, wherein the charged particle beam that passes through the focal point is incident on the cavity portion of the decelerating electrode parallel to the optical axis.

7. The energy filter according to claim 5, wherein the focusing lens system is a magnifying system having the charged particle source as an object point and the focal point as an image point.

8. The energy filter according to claim 5, wherein the focusing lens system includes at least two stages of focusing lenses, and has an intermediate focal point between the two stages of focusing lenses, the focusing lens on an upstream side located closer to the charged particle source of the two stages of focusing lenses forms a reduction system having the charged particle source as an object point and the intermediate focal point as an image point, and the focusing lens on a downstream side located far from the charged particle source of the two stages of focusing lenses forms a magnifying system having the intermediate focal point as an object point and the focal point formed near the entrance of the decelerating electrode as an image point.

9. The energy filter according to claim 2, wherein a relationship between a focal point f of a single-aperture electrode arranged on an entrance side of the charged particle beam in the single-aperture electrode pair and a radius R of the opening portion is expressed as $f=\lambda R$, $\lambda=0.64\pm0.05$.

10. The energy filter according to claim 5, further comprising:

a holding material that holds the focusing lens system, the decelerating electrode, the first electrode, and the second electrode with an insulator; and a shield member that shields an external magnetic stray field.

11. The energy filter according to claim 10, wherein the shield member is made of a magnetic material having a high magnetic permeability, and is connected to an electrode that forms the focusing lens system.

12. The energy filter according to claim 1, wherein a voltage applied to the first electrode is equal to an accelerating voltage of the charged particle beam, and a voltage applied to the second electrode is variable.

13. An energy analyzer, comprising:

the energy filter of claim 1;

a Faraday cup that is located behind the energy filter;

an ammeter that measures a current amount of a charged particle beam flowing into the Faraday cup; and a computer including a ΔE measurement controller that calculates a value of energy dispersion ΔE of the charged particle beam based on the current amount, wherein the ΔE measurement controller executes a process of measuring a differential value from a current amount Ip(Vr) measured by the ammeter when a voltage Vr is applied to the decelerating electrode, and a process of calculating a full width at half maximum of a spectrum indicated by a differential value of the current amount Ip(Vr) with respect to the voltage Vr as a value of the energy dispersion ΔE of the charged particle beam.

14. The energy analyzer according to claim 13, wherein the ΔE measurement controller applies, to the decelerating electrode, a voltage Vr at which the differential value of the current amount Ip(Vr) is maximized or a voltage Vr at which the current amount Ip(Vr) is at an inflection point.

15. A charged particle beam apparatus that irradiates a sample with a charged particle beam and acquires information on the sample, the charged particle beam apparatus comprising:

the energy filter of claim 1;

a charged particle source that is arranged in front of the energy filter; and a power supply that applies a voltage for extracting a charged particle from the charged particle source to a frontmost electrode that forms the energy filter.

16. The charged particle beam apparatus according to claim 15, further comprising:

an electron lens that is arranged behind the energy filter for focusing the charged particle beam onto the sample.

17. The charged particle beam apparatus according to claim 16, further comprising:

an aperture that is arranged between the energy filter and the electron lens, wherein the aperture has a focal point near an exit of the energy filter, and limits part of the charged particles having energy on a high energy side of the charged particle beam that passes through the energy filter by limiting an emission angle of the charged particles emitted from the focal point.

18. The charged particle beam apparatus according to claim 17, comprising:

an aperture that is arranged behind the energy filter;

a Faraday cup that is arranged behind the aperture;

an ammeter for measuring a current amount of a charged particle beam flowing into the Faraday cup;

a computer including a ΔE measurement controller that calculates a value of energy dispersion ΔE of the charged particle beam based on the current amount; and a drive portion that moves a position of the Faraday cup, wherein the ΔE measurement controller executes, a process of measuring a differential value from a current amount Ip(Vr) measured by the ammeter when a voltage Vr is applied to the decelerating electrode, a process of calculating a full width at half maximum of a spectrum indicated by the differential value of the current amount Ip(Vr) with respect to the voltage Vr as a value of the energy dispersion ΔE of the charged particle beam, and a process of applying, to the decelerating electrode, a voltage Vr at which the differential value of the current amount Ip(Vr) is maximized or a voltage Vr at which the current amount Ip(Vr) is at an inflection point, and after applying the voltage Vr to the decelerating electrode, the drive portion removes the Faraday cup from the optical axis.

19. The charged particle beam apparatus according to claim 15, further comprising:

an input lens for collecting charged particles emitted from the sample; and a charged particle detector that detects a charged particle, wherein the energy filter performs energy-selection of the charged particles collected by the input lens, and the charged particle detector detects the charged particles selected by the energy filter.

* * * * *